US 9,153,746 B2

(12) United States Patent
Kojima et al.

(10) Patent No.: US 9,153,746 B2
(45) Date of Patent: Oct. 6, 2015

(54) SEMICONDUCTOR LIGHT EMITTING DEVICE AND METHOD FOR MANUFACTURING SAME

(75) Inventors: Akihiro Kojima, Kanagawa-ken (JP); Yosuke Akimoto, Kanagawa-ken (JP); Hideyuki Tomizawa, Gunma-ken (JP); Hideko Mukaida, Tokyo (JP); Miyoko Shimada, Kanagawa-ken (JP); Yoshiaki Sugizaki, Kanagawa-ken (JP); Hideto Furuyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 13/601,568

(22) Filed: Aug. 31, 2012

(65) Prior Publication Data
US 2013/0313588 A1   Nov. 28, 2013

(30) Foreign Application Priority Data

May 28, 2012 (JP) .................................. 2012-121062

(51) Int. Cl.
*H01L 33/52* (2010.01)
*H01L 33/00* (2010.01)
(Continued)

(52) U.S. Cl.
CPC ..................................... *H01L 33/387* (2013.01)

(58) Field of Classification Search
CPC ..... H01L 33/385; H01L 33/387; H01L 33/00; H01L 33/0079; H01L 33/38; H01L 33/44; H01L 33/486; H01L 33/52; H01L 33/62; H01L 21/50
USPC ............... 257/98, 91, 99, 737, 739, 774, 778, 257/E33.061, E21.499, E33.056; 438/26, 438/27
See application file for complete search history.

(56) References Cited

U.S. PATENT DOCUMENTS 8,110,421 B2   2/2012  Sugizaki et al.
2007/0082486 A1   4/2007  Yang et al.
(Continued)

FOREIGN PATENT DOCUMENTS

JP    2005-109208   4/2005
JP    2007-053357   3/2007
(Continued)

OTHER PUBLICATIONS

Taiwanese Office Action dated Feb. 21, 2015, filed in Taiwan counterpart Application No. 101147160, 14 pages (with translation).
(Continued)

*Primary Examiner* — Julia Slutsker
*Assistant Examiner* — Natalia Gondarenko
(74) *Attorney, Agent, or Firm* — Patterson & Sheridan, LLP

(57) ABSTRACT

According to an embodiment, a semiconductor light emitting device includes a semiconductor layer having a light emitting layer. The device also includes a p-side electrode provided on a first region including the light emitting layer; an n-side electrode provided on a second region layer not including the light emitting layer; and a first insulating film having a first opening communicating with the p-side electrode and a second opening communicating with the n-side electrode. A p-side interconnection is provided on the first insulating film and electrically connected to the p-side electrode through the first opening. An n-side interconnection is provided on the first insulating film and electrically connected to the n-side electrode through the second opening. The p-side interconnection has a plurality of protrusive parts protruding toward the n-side interconnection, and the n-side interconnection has a plurality of portions extending between the protrusive parts of the p-side interconnection.

19 Claims, 20 Drawing Sheets

(51) Int. Cl.
*H01L 33/38* (2010.01)
*H01L 21/50* (2006.01)

(56) References Cited

U.S. PATENT DOCUMENTS

| | | | |
|---|---|---|---|
| 2007/0096130 A1* | 5/2007 | Schiaffino et al. | 257/98 |
| 2008/0157235 A1* | 7/2008 | Rogers et al. | 257/415 |
| 2008/0246051 A1 | 10/2008 | Hosokawa et al. | |
| 2009/0065938 A1* | 3/2009 | Takano et al. | 257/750 |
| 2010/0051986 A1* | 3/2010 | Min et al. | 257/98 |
| 2010/0078670 A1* | 4/2010 | Kim et al. | 257/98 |
| 2010/0148198 A1* | 6/2010 | Sugizaki et al. | 257/98 |
| 2011/0089425 A1 | 4/2011 | Ichijo et al. | |
| 2011/0233586 A1 | 9/2011 | Kojima et al. | |
| 2011/0260184 A1 | 10/2011 | Furuyama | |
| 2011/0300651 A1 | 12/2011 | Kojima et al. | |
| 2012/0083056 A1 | 4/2012 | Shinbori et al. | |

FOREIGN PATENT DOCUMENTS

| | | |
|---|---|---|
| JP | 2007-243047 | 9/2007 |
| JP | 2008-258459 | 10/2008 |
| JP | 2009-117583 | 5/2009 |
| JP | 2010-093186 | 4/2010 |
| JP | 2010141176 A | 6/2010 |
| JP | 2011199193 A | 10/2011 |
| JP | 2011233650 A | 11/2011 |
| JP | 2011-253925 | 12/2011 |
| JP | 2012-028819 | 2/2012 |
| TW | 200949944 A | 12/2009 |
| TW | 201214798 A | 4/2012 |

OTHER PUBLICATIONS

Japanese Office Action dated Jul. 1, 2015, filed in Japanese counterpart Application No. 2012-121062, 6 pages (with translation).

* cited by examiner

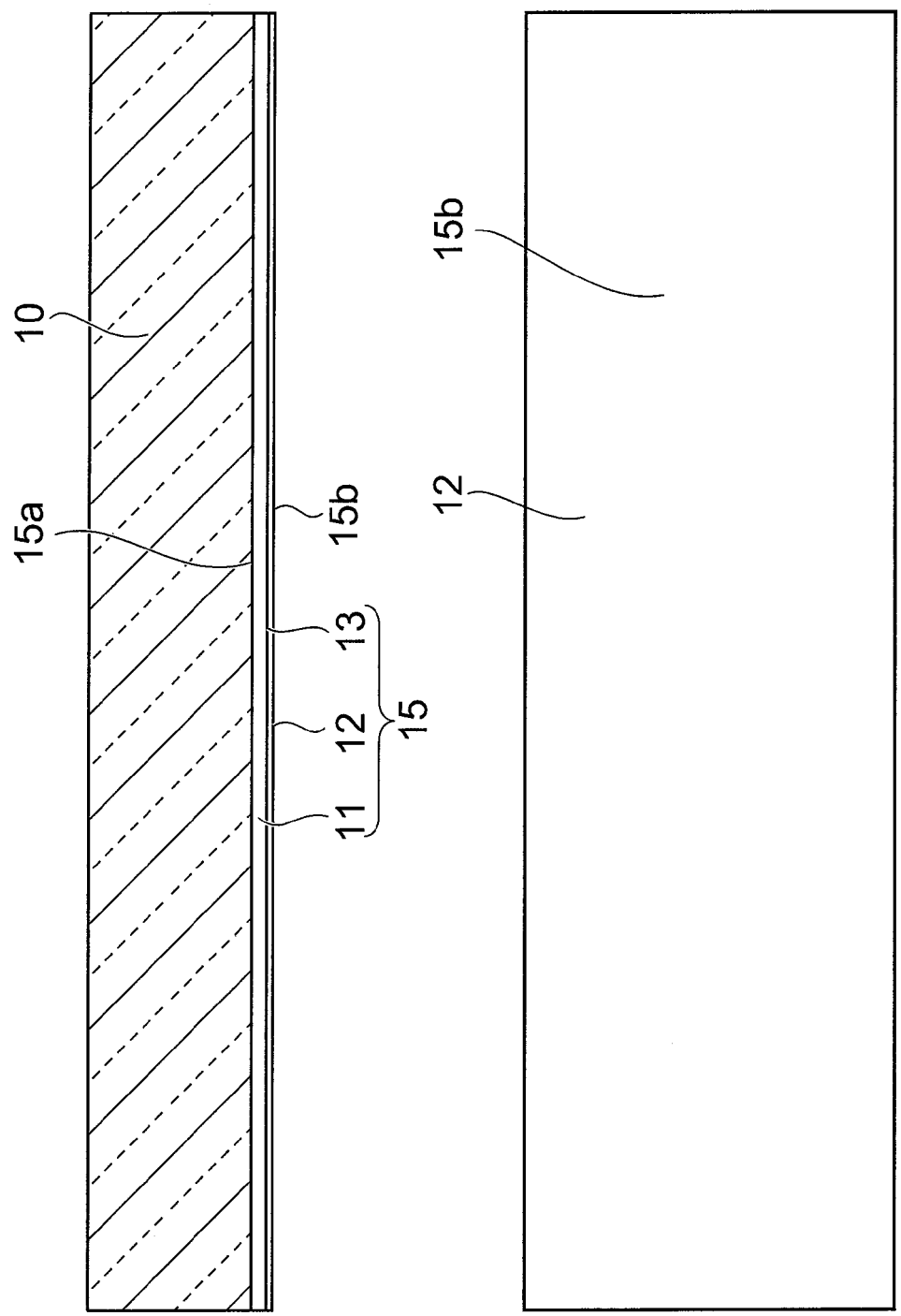

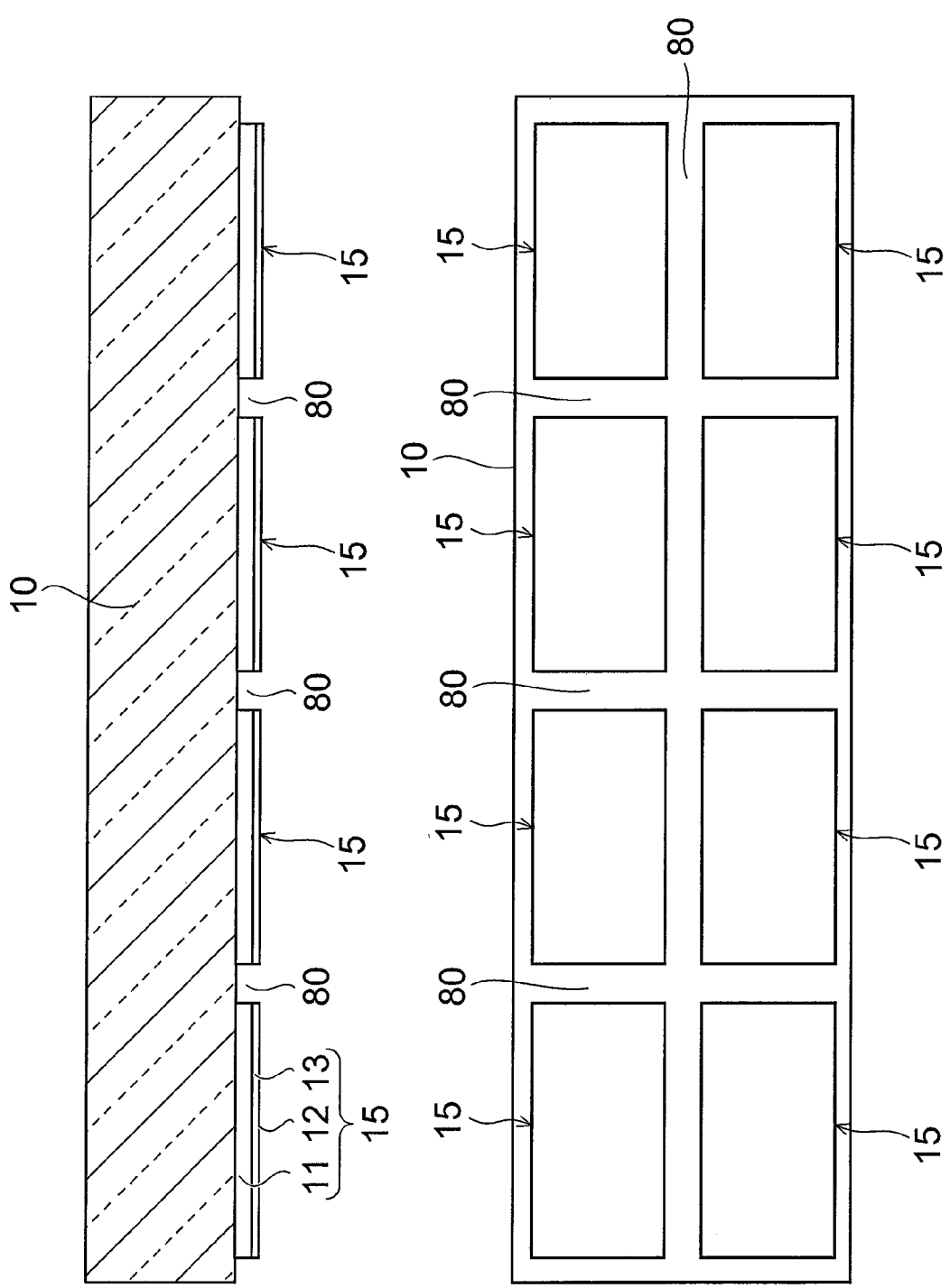

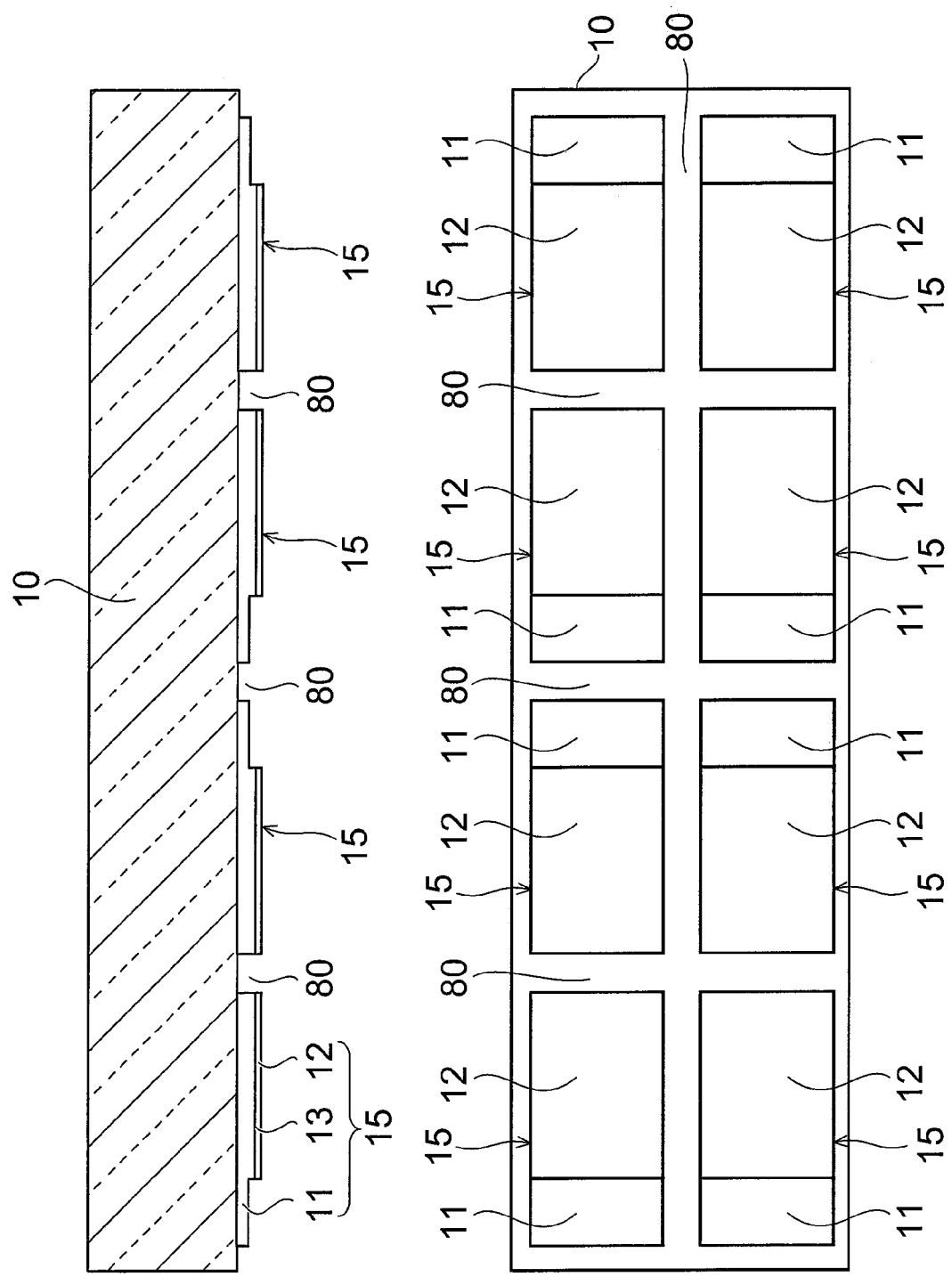

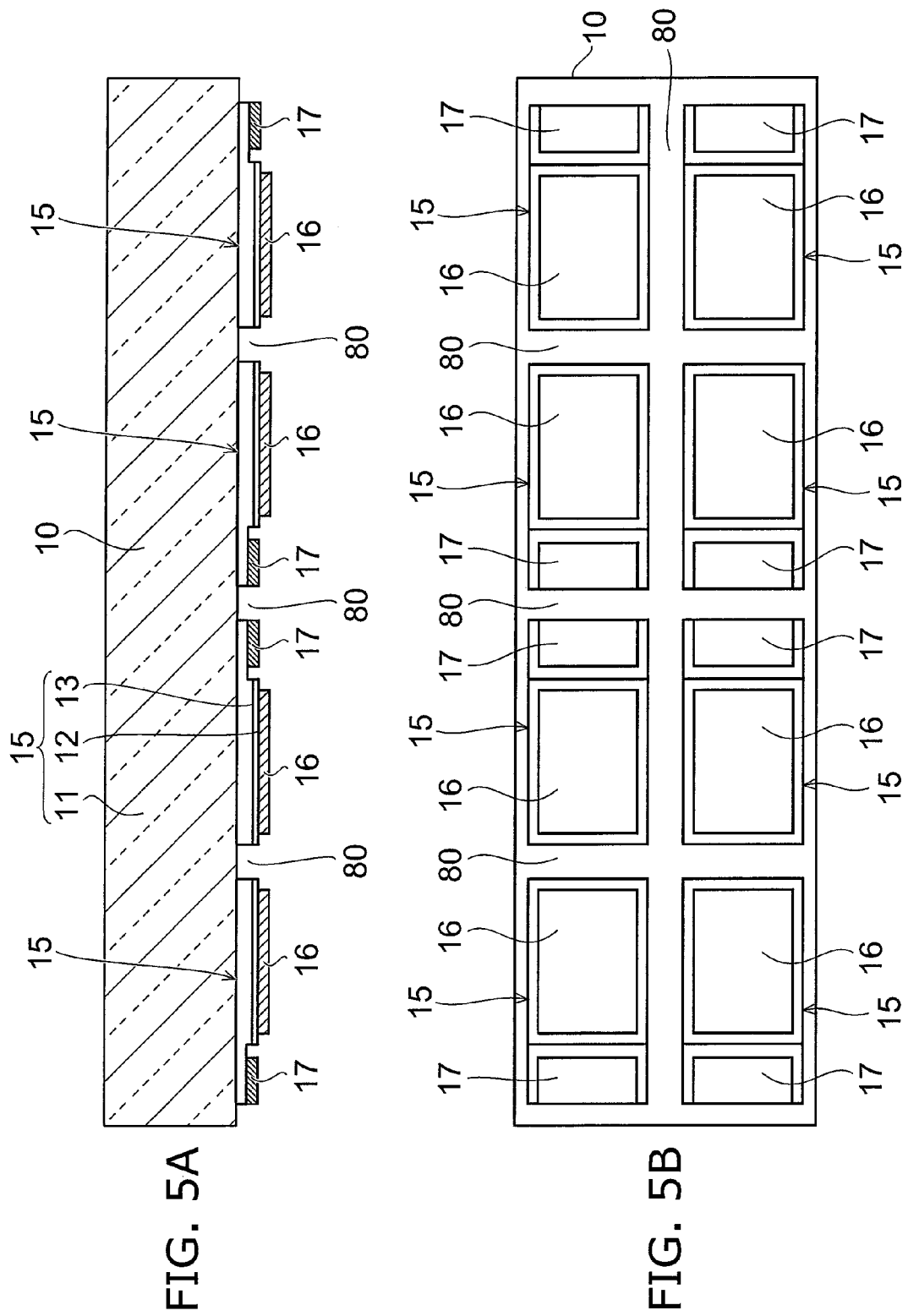

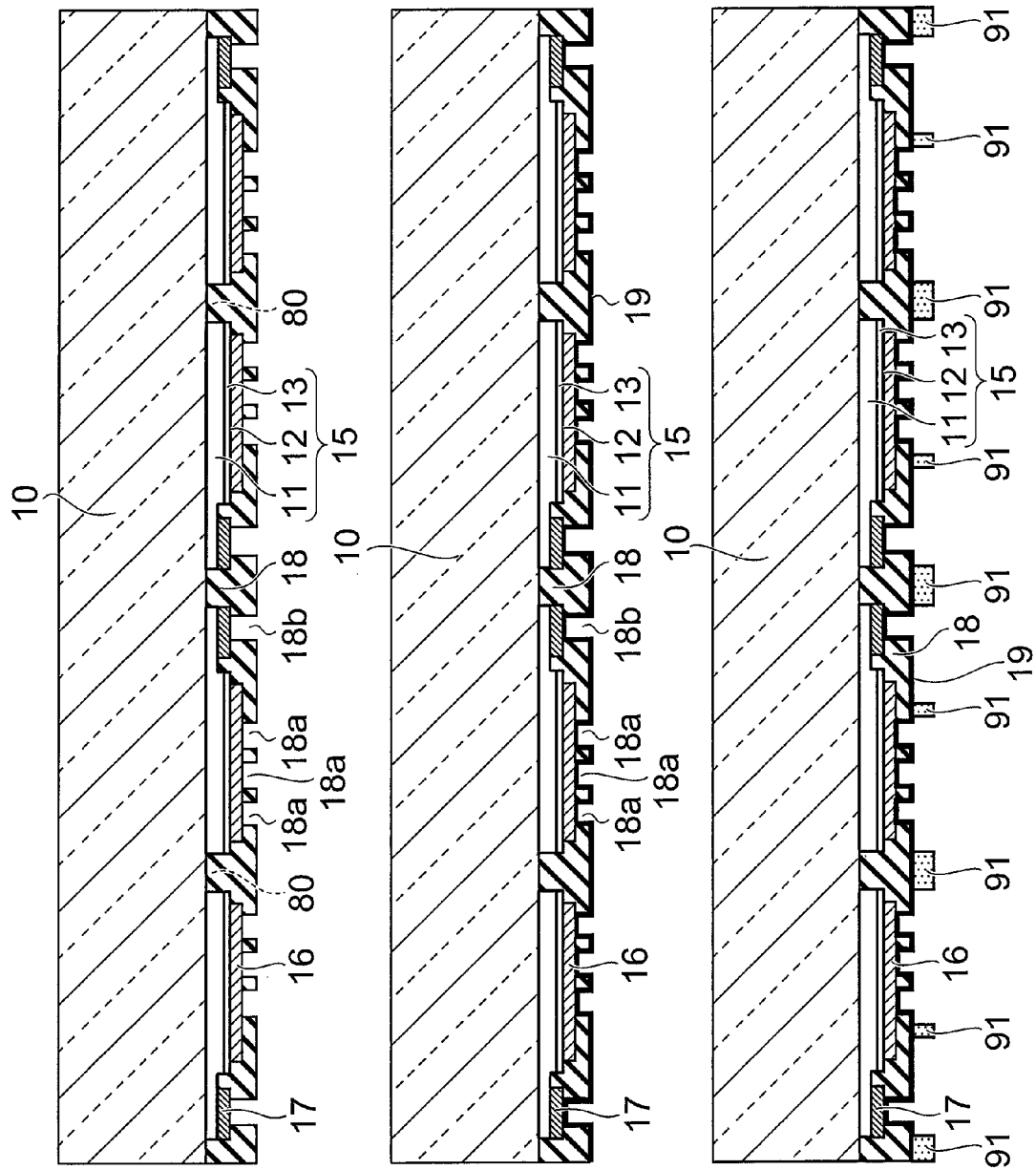

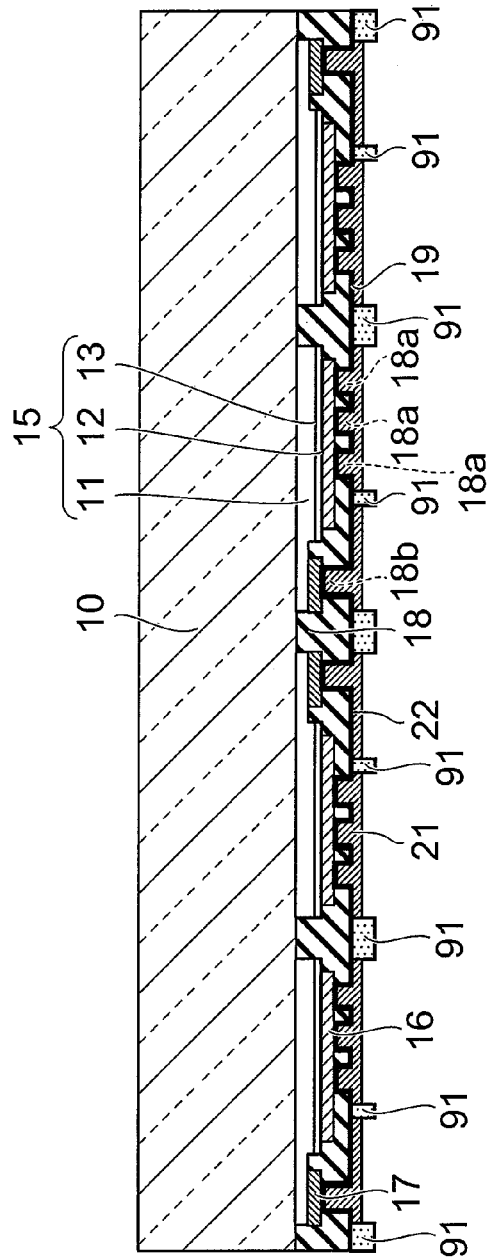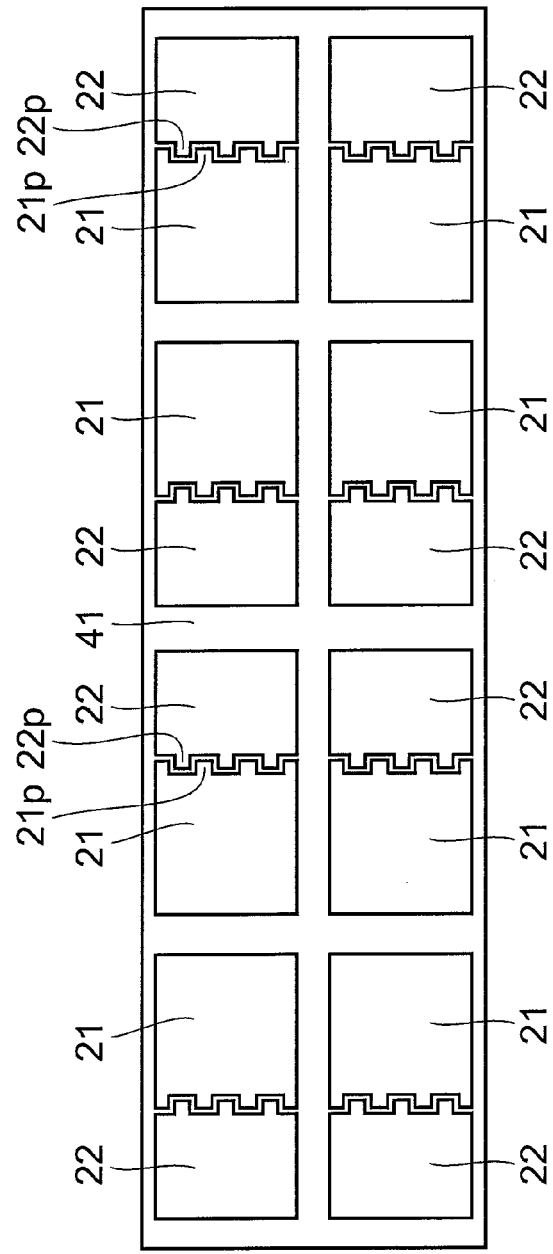
FIG. 7A
FIG. 7B

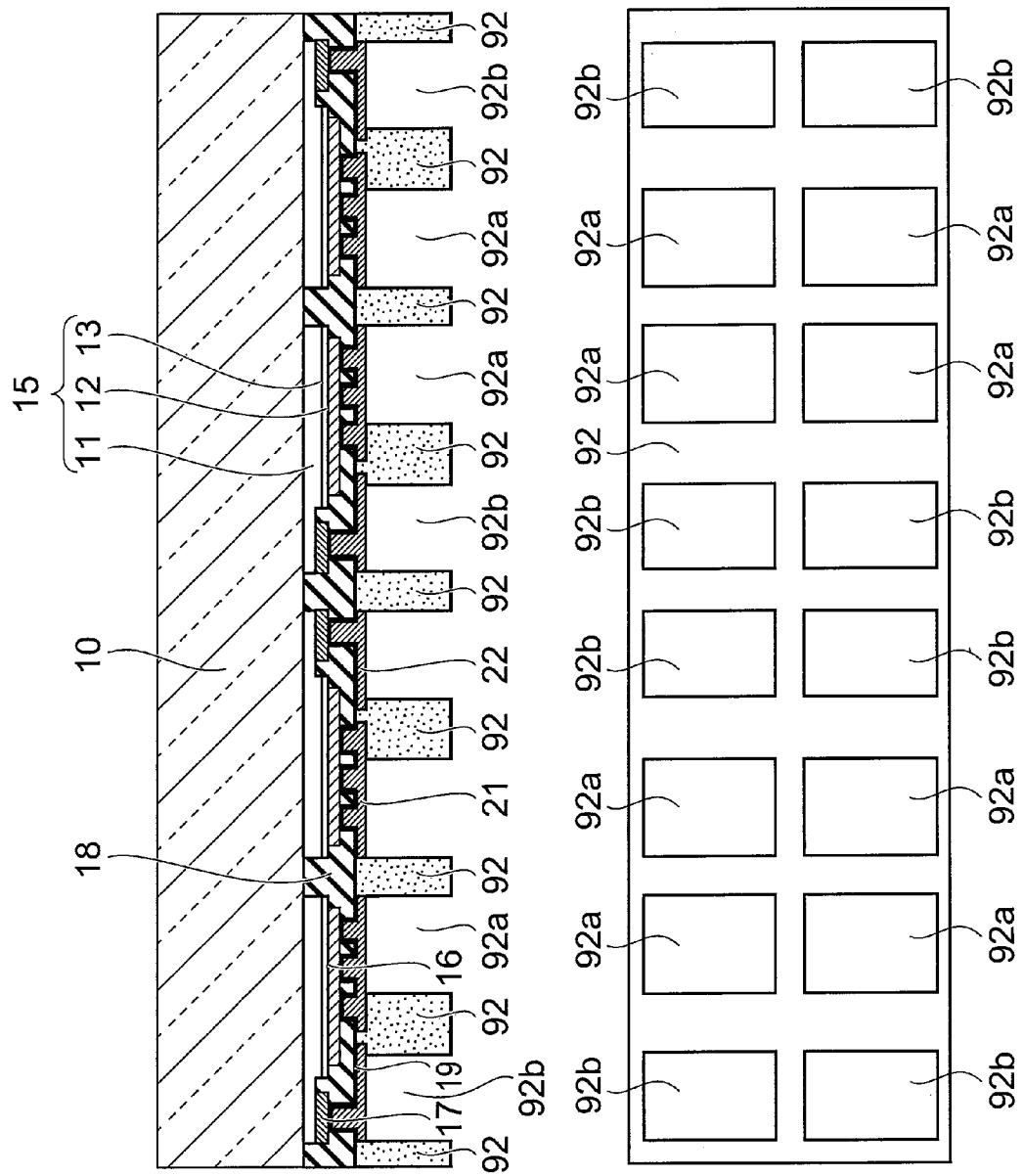

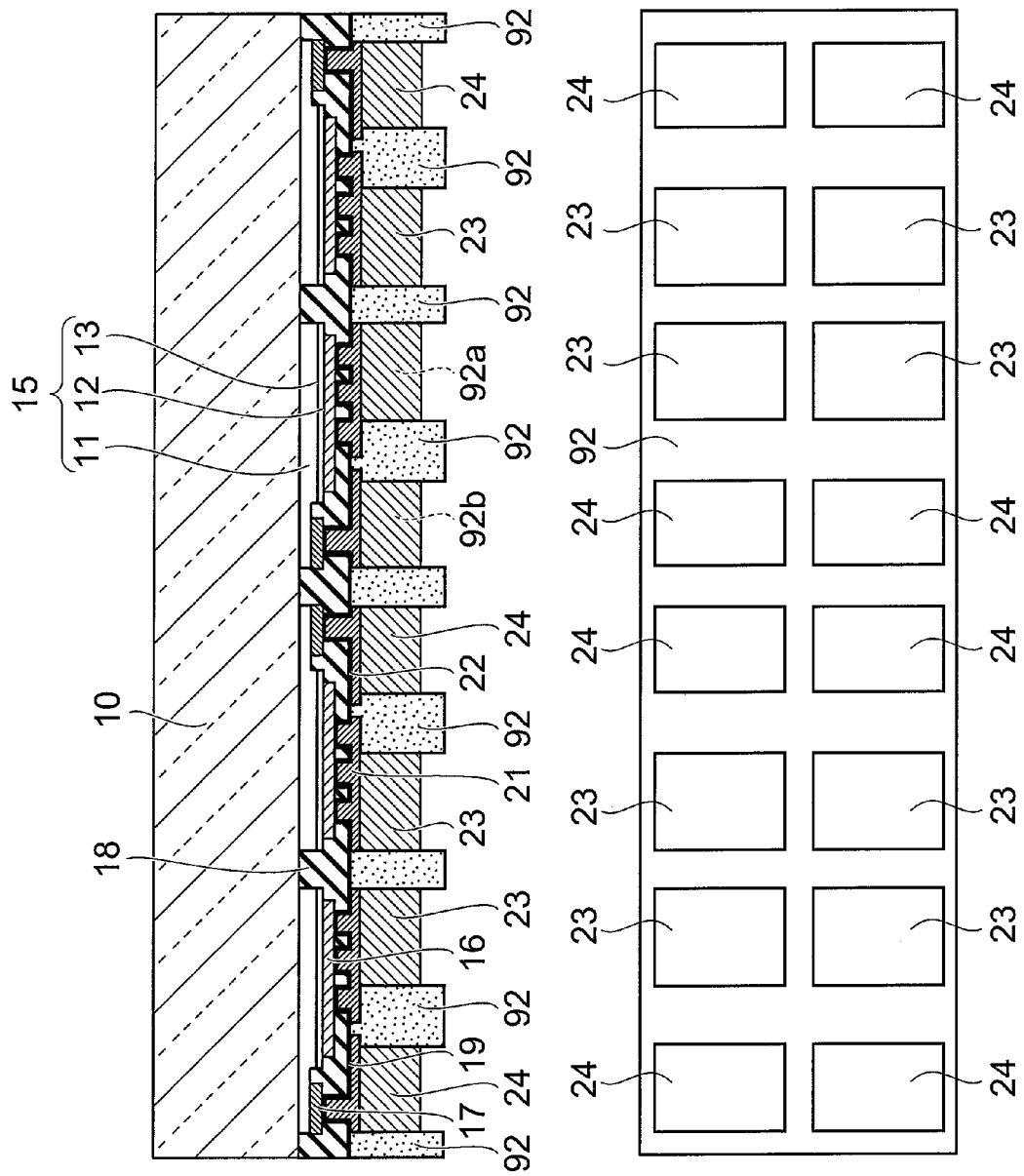

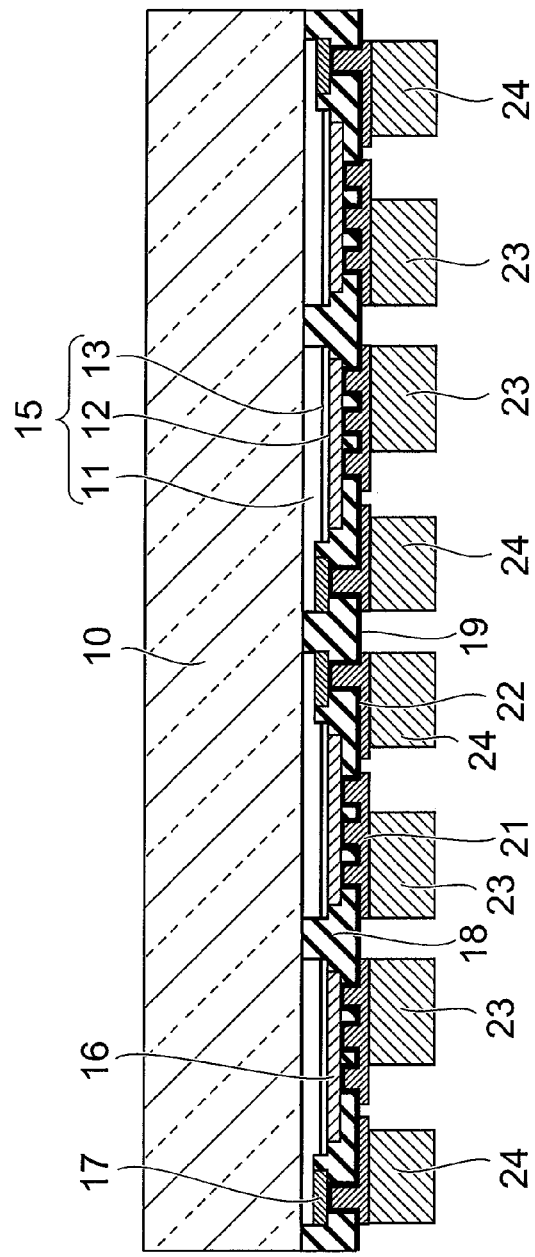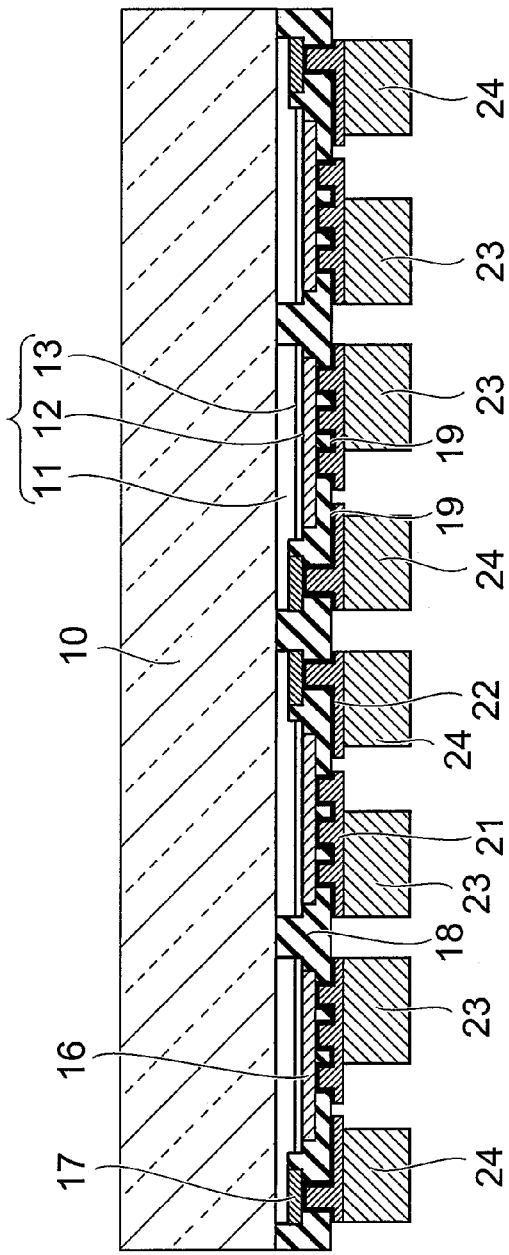
FIG. 10A
FIG. 10B

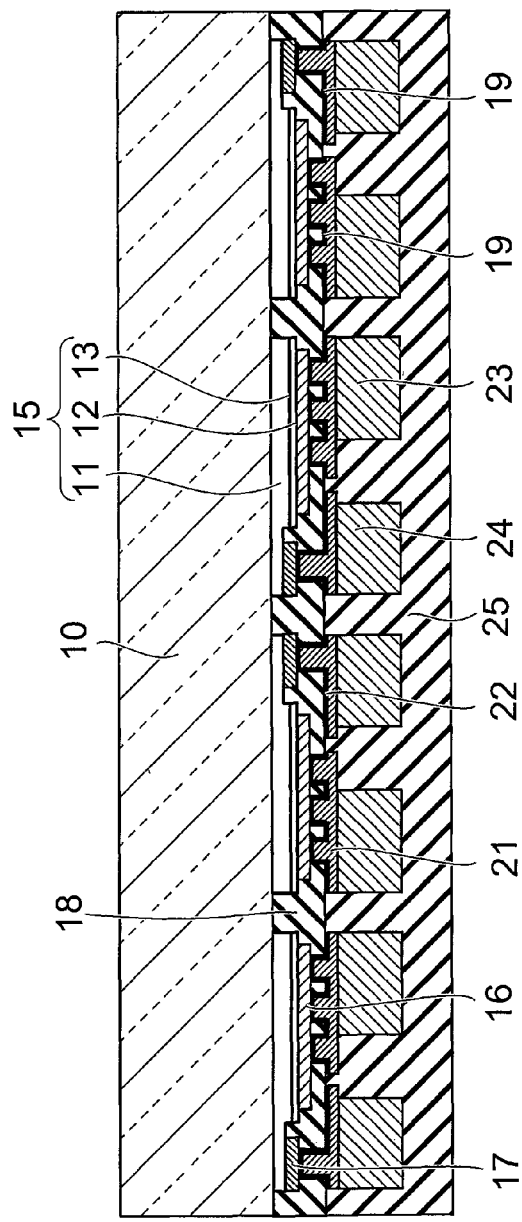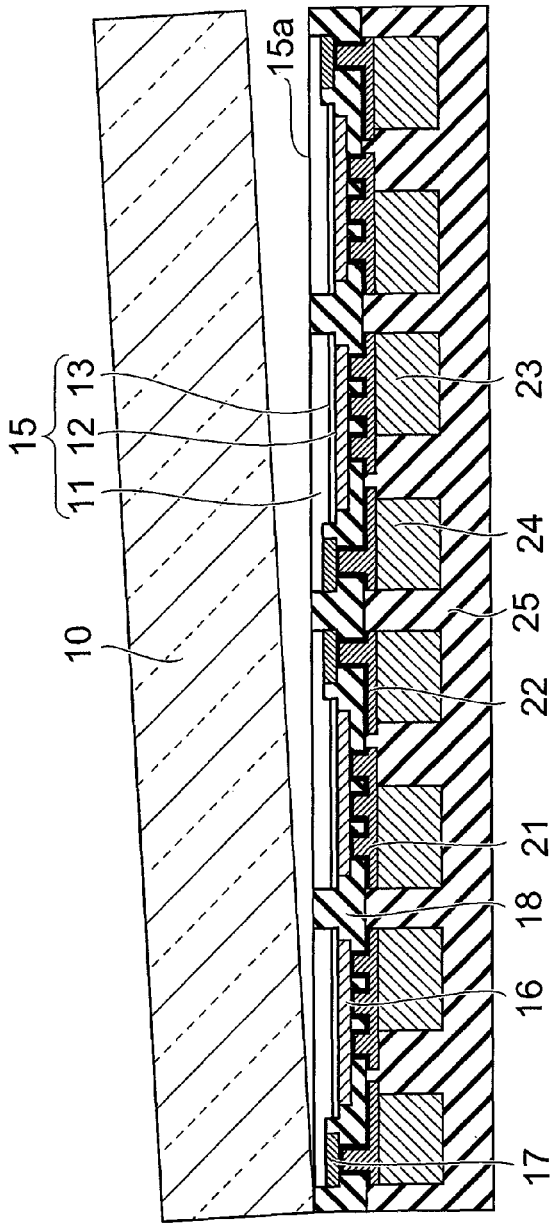
FIG. 11A
FIG. 11B

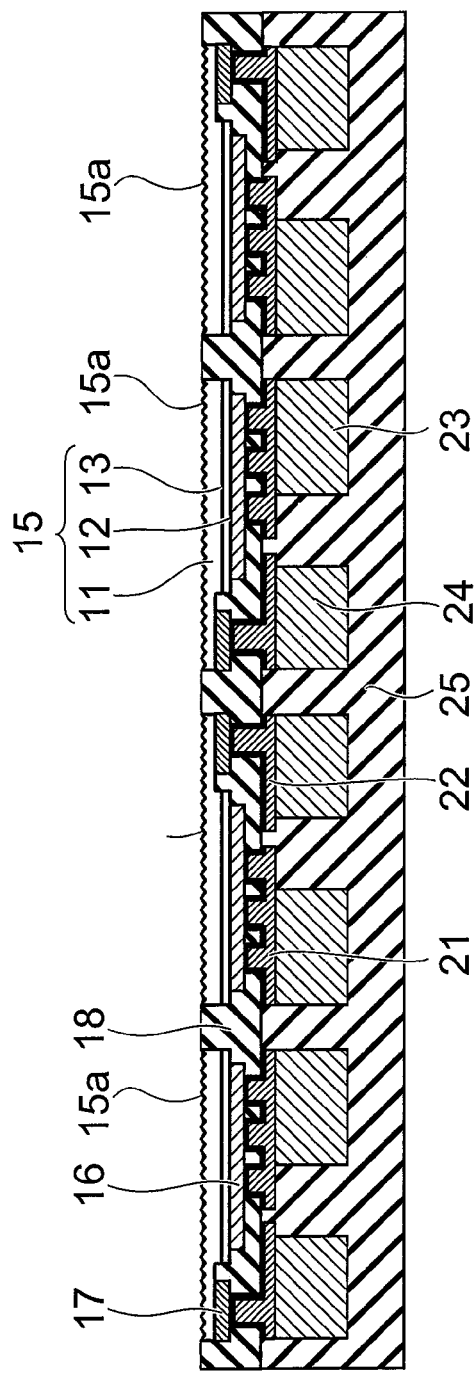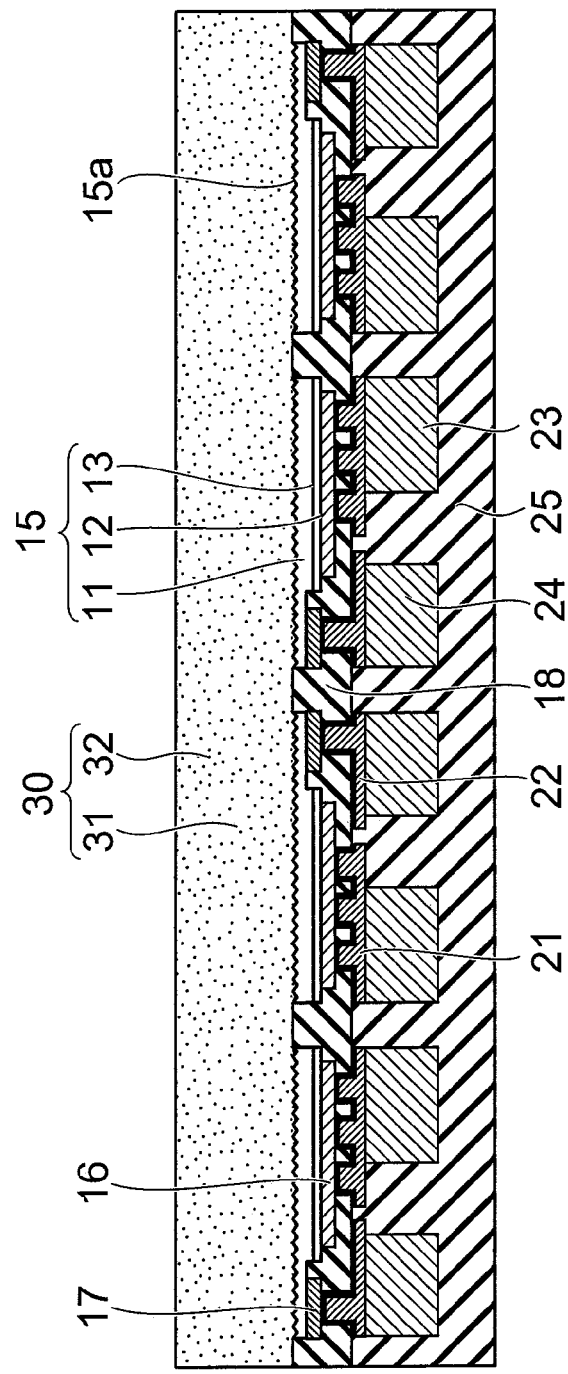
FIG. 12A
FIG. 12B

| PROCESS | WAFER CURVATURE |
|---|---|
| EPITAXIAL GROWTH TO INTERCONNECT LAYER FORMATION | 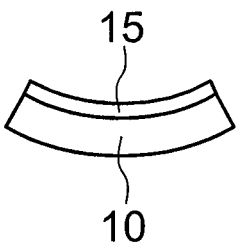 |
| SECOND INSULATING FILM FORMATION | 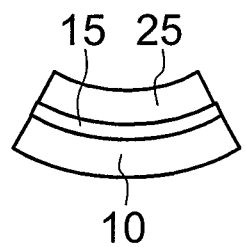 |
| SUBSTRATE REMOVAL | 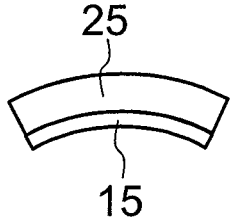 |
| FLUORESCENT SUBSTANCE LAYER FORMATION | 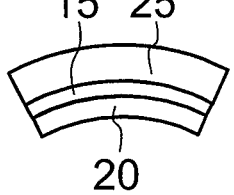 |
FIG. 17

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from Japanese Patent Application No. 2012-121062, filed on May 28, 2012; the entire contents of which are incorporated herein by reference.

FIELD

Embodiments are generally related to a semiconductor light emitting device and a method for manufacturing the same.

BACKGROUND

Semiconductor light emitting devices that emit visible light such as white light or light of the other wavelength band will be widely used as small-sized and easily handled light sources. Such a device includes a semiconductor light emitting element and fluorescent substances, and emits light combining the radiations of the semiconductor light emitting element and the fluorescent substances. For example, housing a semiconductor layer separated from a substrate in a resin package realizes a small semiconductor light emitting device having a low height. However, the characteristics of the semiconductor light emitting device may vary depending on the stress applied to the resin sealed semiconductor layer.

BRIEF DESCRIPTION OF THE DRAWINGS

FIGS. 2A to 13B are schematic views illustrating manufacturing process of the semiconductor light emitting device according to the first embodiment;

FIG. 17 is a schematic view illustrating characteristics of a semiconductor light emitting device according to a second embodiment;

DETAILED DESCRIPTION

Figure 1A:
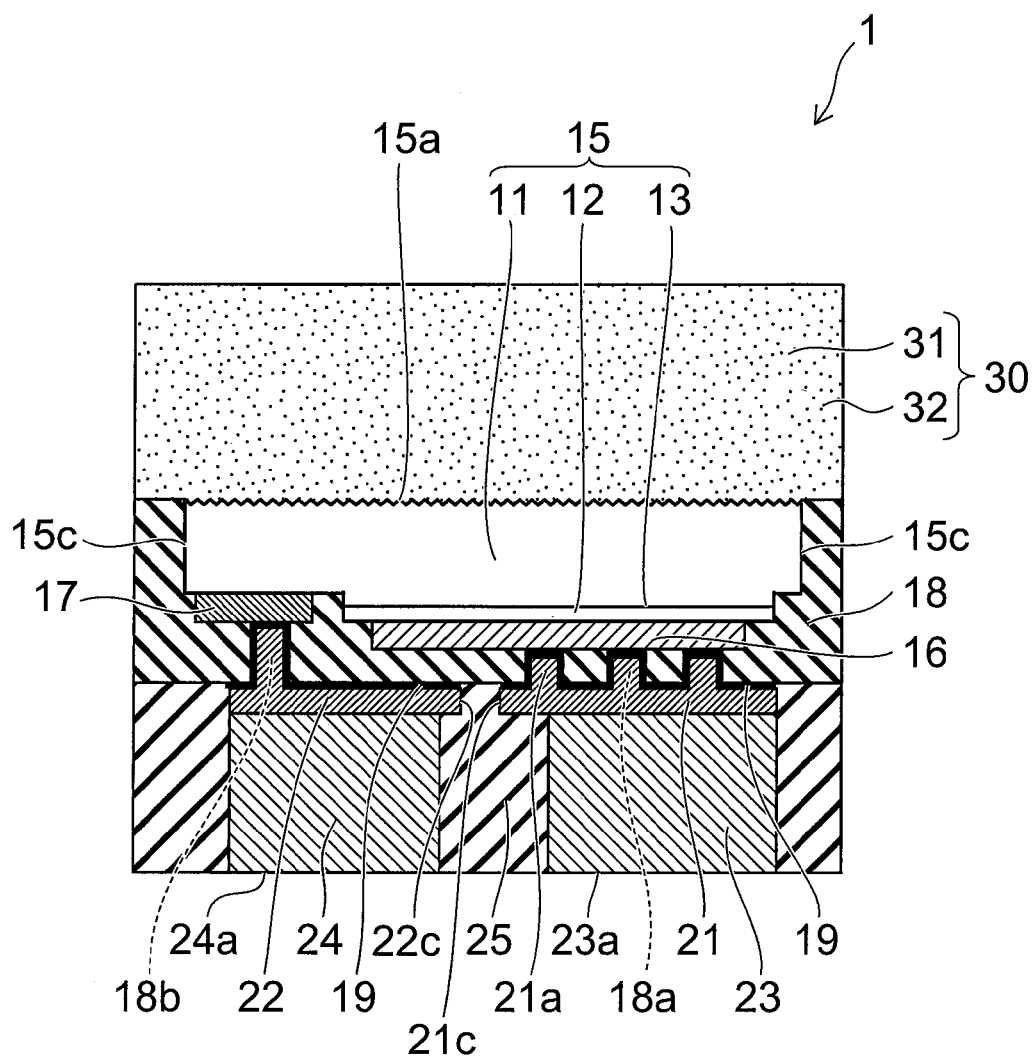
FIGS. 1A and 1B are schematic cross-sectional views of a semiconductor light emitting device according to a first embodiment.

According to an embodiment, a semiconductor light emitting device includes a semiconductor layer having a first face, a second face on a side opposite to the first face, and a light emitting layer. The device also includes a p-side electrode provided on a first region on the second face side, the first region including the light emitting layer; an n-side electrode provided on a second region layer on the second face side, the second region not including the light emitting layer; and a first insulating film provided on the second face side and having a first opening communicating with the p-side electrode and a second opening communicating with the n-side electrode. A p-side interconnection provided on the first insulating film and electrically connected to the p-side electrode through the first opening. An n-side interconnection provided on the first insulating film; the n-side interconnection is separated from the p-side interconnection and electrically connected to the n-side electrode through the second opening. The p-side interconnection has a plurality of protrusive parts protruding toward the n-side interconnection, and the n-side interconnection has a plurality of portions extending between the protrusive parts of the p-side interconnection.

Embodiments will be described with reference to the drawings. Like reference numerals in the drawings denote like elements, and the descriptions of the like elements are appropriately omitted and the different elements are described.

First Embodiment

FIG. 1 is a schematic cross-sectional view of a semiconductor light emitting device 1 according to a first embodiment. The semiconductor light emitting device 1 includes a semiconductor layer 15 that includes a light emitting layer 13. The semiconductor layer 15 has a first face 15a and a second face that is located on a side opposite to the first face 15a. On a second face side, electrodes and an interconnection part are provided, and light is emitted mainly to the outer side from the first face 15a on which the electrodes and the interconnection part are not provided.

The semiconductor layer 15 includes a first semiconductor layer 11 and a second semiconductor layer 12. The first semiconductor layer 11 and the second semiconductor layer 12, for example, contain gallium nitride. The first semiconductor layer 11 may include an underlying buffer layer, an n-type GaN layer, and the like. The second semiconductor layer 12 includes a p-type GaN layer, a light emitting layer (active layer) 13, and the like. The light emitting layer 13 may include a material that emits blue light, purple light, blue-purple light, ultraviolet light, or the like.

The semiconductor layer 15 includes a first region including the light emitting layer 13 and a second region not including the light emitting layer 13 as shown in FIG. 1. The first region is provided with a larger area than the second region.

The second face of the semiconductor layer 15 is formed in a concavo-convex shape, and a convex part includes the light emitting layer 13. A p-side electrode 16 is provided on the surface of the second semiconductor layer 12, which is the surface of the convex part. In other words, the p-side electrode 16 is provided on the first region of the second face that is the top surface of the convex part of the semiconductor layer 15.

In the second surface of the semiconductor layer 15, the second region is provided on a side of the convex part, where the light emitting layer 13 is removed and a surface of the first semiconductor layer 11 is exposed. An n-side electrode 17 is provided on the exposed surface of the first semiconductor layer 11. In other words, the n-side electrode 17 is provided on the second region of the second surface that is the surface of the part not including the light emitting layer 13.

A first insulating film (hereinafter, simply referred to as an insulating film 18) is provided on the second face side of the semiconductor layer 15. The insulating film 18 covers the semiconductor layer 15, the p-side electrode 16, and the n-side electrode 17. In addition, the insulating film 18 covers the side surfaces of the light emitting layer 13 and the second semiconductor layer 12 for the protection thereof.

In addition, another insulating film (for example, a silicon oxide film) may be provided between the insulating film 18 and the semiconductor layer 15. The insulating film 18, for example, is formed of a resin such as polyimide that is superior for the patterning of fine openings. Alternatively, an inorganic film such as a silicon oxide film or a silicon nitride film may be used as the material of the insulating film 18.

The insulating film 18 is not provided on the first face 15a. The insulating film 18 covers a side surface 15c for the protection which extends from the first face 15a to the second face in the semiconductor layer 15.

A p-side interconnection layer 21 and an n-side interconnection layer 22 are provided on a face of the insulating film 18 opposite to the second face of the semiconductor layer 15, so as to be separated from each other.

Parts of the p-side interconnection layer 21 are provided in a plurality of first openings 18a that are formed in the insulating film 18 up to the p-side electrodes 16, and the p-side interconnection layer 21 is electrically connected to the p-side electrodes 16. A part of the n-side interconnection layer 22 is also provided in a second opening 18b that is formed in the insulating film 18 up to the n-side electrodes 17, and the n-side interconnection layer 22 is electrically connected to the n-side electrodes 17.

A p-side metal pillar 23 is provided on a face of the p-side interconnection layer 21 opposite to the p-side electrode 16. Then, a p-side interconnection according to the embodiment includes the p-side interconnection layer 21, the p-side metal pillar 23, and a metal film 19 that serves as a seed layer to be described later.

An n-side metal pillar 24 is provided on a face of the n-side interconnection layer 22 opposite to the n-side electrodes 17. Then, an n-side interconnection according to the embodiment includes the n-side interconnection layer 22, the n-side metal pillar 24, and the metal film 19 that is used as the seed layer.

A resin layer 25 serving as a second insulating film is stacked on the insulating film 18. The resin layer 25 covers the periphery of the p-side interconnection and the periphery of the n-side interconnection. In addition, the resin layer 25 is filled up between the p-side metal pillar 23 and the n-side metal pillar 24. The side surfaces of the p-side metal pillar 23 and the n-side metal pillar 24 are covered with the resin layer 25.

A face of the p-side metal pillar 23 opposite to the p-side interconnection layer 21 is exposed from the resin layer 25 and serves as a p-side external terminal 23a. A face of the n-side metal pillar 24 opposite to the n-side interconnection layer 22 is exposed from the resin layer 25 and serves as an n-side external terminal 24a. The p-side external terminal 23a and the n-side external terminal 24a are bonded to a pad formed in a mounting substrate through a bonding member such as a solder, other metal, a material having conductivity, or the like.

The p-side external terminal 23a and the n-side external terminal 24a are exposed on the same face (the lower face in FIG. 1) of the resin layer 25, having a longer distance therebetween than a distance between the p-side interconnection layer 21 and the n-side interconnection layer 22 on the insulating film 18. The p-side external terminal 23a and the n-side external terminal 24a are separated from each other with such a distance, so that the external terminals do not form a short circuit via solder or the like at the time of being mounted on the mounting substrate.

On the other hand, the p-side interconnection layer 21 may approach the n-side interconnection layer 22 up to a process limit, and accordingly, the area of the p-side interconnection layer 21 may be widened. Thereby, the contact area can be enlarged between the p-side interconnection layer 21 and the p-side electrode 16.

Furthermore the area of the p-side interconnection layer 21 that is in contact with the p-side electrodes 16 through the plurality of first openings 18a is possible to be larger than the area of the n-side interconnection layer 22 that is in contact with the n-side electrodes 17 through the second openings 18b. The current distribution toward the light emitting layer 13 is uniformized, and thereby it becomes possible to reduce the current density in the light emitting layer 13. The heat dissipation of the light emitting layer 13 may also be improved via the p-side interconnection layer.

According to the embodiment, a high optical output can be acquired, since the light emitting layer 13 is formed over the first region that is larger than the second region on which the n-side electrode 17 is provided. In addition the n-side interconnection layer 22 having a larger area than the n-side electrode 17 can be provided on the mounting face side. Then, the portion of the n-side interconnection layer 22 extending on the insulating film 18 can be formed to have larger area than the contact portion that is in contact with the n-side electrodes 17.

The first semiconductor layer 11 is electrically connected to the n-side metal pillar 24 having the n-side external terminal 24a through the n-side electrode 17, the metal film 19, and the n-side interconnection layer 22. The second semiconductor layer 12 including the light emitting layer 13 is electrically connected to the p-side metal pillar 23 having the p-side external terminal 23a through the p-side electrode 16, the metal film 19, and the p-side interconnection layer 21.

The p-side metal pillar 23 is thicker than the p-side interconnection layer 21, and the n-side metal pillar 24 is thicker than the n-side interconnection layer 22. Each thickness of the p-side metal pillar 23, the n-side metal pillar 24, and the resin layer 25 is larger than that of the semiconductor layer 15. Here, the "thickness" represents a thickness in the vertical direction in FIG. 1.

In addition, each thickness of the p-side metal pillar 23 and the n-side metal pillar 24 is larger than that of a stacked body that includes the semiconductor layer 15, the p-side electrode 16, the n-side electrode 17, and the insulating film 18. In addition, the aspect ratio (the ratio of the thickness to the planar size) of each one of the metal pillars 23 and 24 is not limited to be one or more, and the ratio may be less than one. In other words, each thickness of the metal pillars 23 and 24 may be smaller than the planar size of the metal pillars 23 and 24.

Copper, gold, nickel, silver, and the like can be used as the materials of the p-side interconnection layer 21, the n-side interconnection layer 22, the p-side metal pillar 23, and the n-side metal pillar 24. Among these materials, copper is superior to the other material in thermal conductivity, resistance for migration, and adhesiveness to an insulating material.

In addition, when the semiconductor light emitting device 1 is mounted on the mounting substrate through the p-side external terminal 23a and the n-side external terminal 24a, the stress applied to the semiconductor layer 15 through soldering or the like can be absorbed and relieved by the p-side metal pillar 23 and the n-side metal pillar 24.

The p-side interconnection that includes the p-side interconnection layer 21 and the p-side metal pillar 23 is connected to the p-side electrode 16 through a plurality of vias 21a that are provided inside the plurality of first openings 18a and are separated from each other. Accordingly, an effective stress relieving can be obtained through the p-side interconnection.

Alternatively, the p-side interconnection layer 21 may be connected to the p-side electrode 16 through a post that is provided inside one large first opening 18a and has a planar size larger than the via 21a. In such a case, the heat dissipation of the light emitting layer 13 can be improved through the p-side electrode 16, the p-side interconnection layer 21, and the p-side metal pillar 23, all of which are formed of metal.

The resin layer 25 reinforces the p-side metal pillar 23 and the n-side metal pillar 24. It is preferable that the thermal expansion coefficient of the resin layer 25 is the same as or close to the thermal expansion coefficient of the mounting substrate. As examples of such a resin layer 25, there are an epoxy resin, a silicone resin, a fluorine resin, and the like.

A fine concavo-convex is formed on the first face 15a of the semiconductor layer 15 using wet etching (frost process), where an alkali-based solution is applied to the first face 15a. The light emitted from the light emitting layer 13 can be extracted outside through the first face 15a, suppressing light reflection at various incident angles by providing the concavo-convex on the first face 15a.

A fluorescent substance layer 30 is provided on the first face 15a. The fluorescent substance layer 30 includes a transparent resin 31 and a plurality of fluorescent substances 32 dispersed in the transparent resin 31. The transparent resin 31 has transparency for the lights emitted from the light emitting layer 13 and the fluorescent substance 32. For example, a silicone resin, an acrylic resin, a phenyl resin, or the like may be used as the transparent resin 31. The fluorescent substance 32 absorbs the light emitted from the light emitting layer 13 (excited light) and emits wavelength-converted light. Accordingly, the semiconductor light emitting device 1 can emit mixed lights emitted from the light emitting layer 13 and the fluorescent substance 32.

In a case where the fluorescent substance 32 is a yellow fluorescent substance that emits yellow light, a white color, a light bulb color, or the like can be obtained as a mixed color of blue light emitted from the light emitting layer 13, which contains a GaN-based material, and the yellow light emitted from the fluorescent substance 32. In addition, the fluorescent substance layer 30 may be configured to contain a plurality of types of fluorescent substances (for example, a red fluorescent substance that emits red light and a green fluorescent substance that emits green light).

In a manufacturing process of the semiconductor light emitting device 1 according to the embodiment, a substrate 10 used to form the semiconductor layer 15 is removed (see FIG. 11B). The semiconductor layer 15 having the substrate 10 removed is stably supported by the p-side metal pillar 23, the n-side metal pillar 24, and the insulating film 25 and thus the mechanical strength of the semiconductor light emitting device 1 can be increased.

In addition, strong internal stress occurred during the epitaxial growth between the substrate 10 and the semiconductor layer 15 is released at once when removing the substrate 10. The insulating film 25 and the metal that configures the p-side metal pillar 23 and the n-side metal pillar 24 are more flexible than the material of the semiconductor layer 15. Then, these flexible members support the semiconductor layer 15 after removing the substrate 10. Thereby, the flexible support body that includes the insulating film 25, the p-side metal pillar 23 and the n-side metal pillar 24 may absorb the released stress, preventing, for example, the semiconductor layer 15 from being destroyed.

Figure 1B:
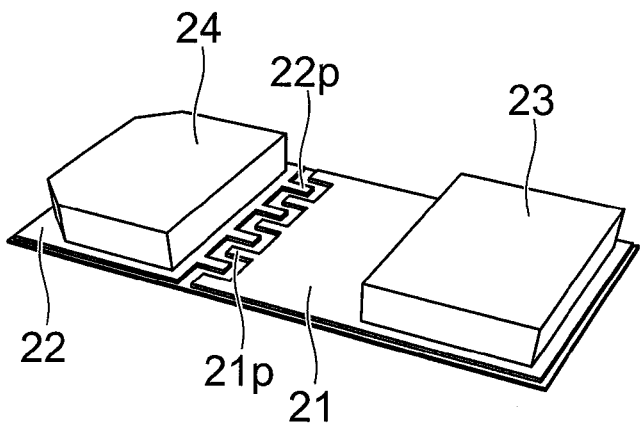

FIG. 1B is a perspective view schematically illustrating a p-side interconnection and an n-side interconnection provided on the insulating film 18. In other words, an illustration is given of the p-side interconnect layer 21, the n-side interconnect layer 22, the p-side metal pillar 23, and the n-side metal pillar 24 in a state in which the insulating film 25 is removed.

As illustrated in FIG. 1B, the p-side interconnect layer 21 has a plurality of protrusive parts 21p that is provided so as to be separated from the n-side interconnect layer 22 and that projects toward the n-side interconnect layer 22. Meanwhile, the n-side interconnect layer 22 has a plurality of parts (hereinafter, protrusive part 22p) that extends between the protrusive parts 21p of the p-side interconnect layer 21. For example, the protrusive part 21p of the p-side interconnect layer 21 is provided in a rectangular shape, and the protrusive part 22p of the n-side interconnect layer 22, similarly provided in a rectangular shape, extends between adjacent protrusive parts 21p.

Providing a concavo-convex on the respective facing sides of the p-side interconnect layer 21 and the n-side interconnect layer 22 and arranging mutual protrusive parts in a nested shape in this manner, allows the stress applied to the semiconductor layer 15 from the p-side interconnection and the n-side interconnection to be reduced. Thereby, it becomes possible to suppress variance in the optical characteristics and to improve the reliability in the semiconductor light emitting device 1.

Next, a method of manufacturing the semiconductor light emitting device 1 according to the embodiment will be described with reference to FIGS. 2A to 13B. FIGS. 2A to 13B are schematic views illustrating partial areas of a wafer.

FIG. 2A is a schematic cross-sectional view of a stacked body in which a first semiconductor layer 11 and a second semiconductor layer 12 are formed on a major face (the lower face in FIG. 2A) of a substrate 10. FIG. 2B is a schematic view corresponding to a lower face in FIG. 2A.

The first semiconductor layer 11 is formed on the major face of the substrate 10, and the second semiconductor layer 12 including a light emitting layer 13 is formed thereon. For example, the first semiconductor layer 11 and the second semiconductor layer 12 may contain gallium nitride, and grown on a sapphire substrate by using a metal organic chemical vapor deposition (MOCVD) method. Alternatively, a silicon substrate may be used as the substrate 10.

A first face 15a of the semiconductor layer 15 is a face through which the first semiconductor layer 11 is in contact with the substrate 10, and a second face 15b of the semiconductor layer 15 is the surface of the second semiconductor layer 12 opposite to the first semiconductor layer 11.

Next, as shown in FIG. 3A, a groove 80 is formed passing through the semiconductor layer 15 and reaching the substrate 10, for example, by using a reactive ion etching (RIE) method using a resist mask (not shown). As shown FIG. 3B corresponding to the lower face of FIG. 3A, the groove 80 is formed, for example, in a lattice pattern on the substrate 10, and separates the semiconductor layer 15 into a plurality of chips on the substrate 10.

Alternatively, the process for separating the semiconductor layer 15 into multiple parts may be performed after selectively removing the second semiconductor layer 12, or after forming the p-side electrode 16 and the n-side electrode.

Next, as shown in FIG. 4A and FIG. 4B corresponding to the lower face of FIG. 4A, parts of the second semiconductor layer 12 are removed so as to expose parts of the first semiconductor layer 11, for example, by using the RIE method using a resist mask (not shown).

Each region in which the first semiconductor layer 11 is exposed (the second region) does not include the light emitting layer 13 as shown in FIG. 4A. The area of the second semiconductor layer 12 (the first region) that includes the light emitting layer 13 is larger than the exposed area of the first semiconductor layer 11 as shown in FIG. 4B.

Next, as shown in FIG. 5A and FIG. 5B corresponding to the lower face of FIG. 5A, p-side electrodes 16 and n-side electrodes 17 are formed on the second face of the semiconductor layer 15. The p-side electrodes 16 are formed on the surfaces of the second semiconductor layer 12. The n-side electrodes 17 are formed on the exposed surfaces of the first semiconductor layer 11.

The p-side electrodes 16 and the n-side electrodes 17, for example, are formed using a sputtering method, a vapor deposition method, or the like. Either the p-side electrodes 16 or the n-side electrodes 17 may be formed first, or the p-side electrode 16 and n-side electrodes 17 may be simultaneously formed and inevitably made of the same material.

The p-side electrode 16 has preferably formed so as to reflect the light emitted from the light emitting layer 13. Hence, the p-side electrode 16 may include silver, silver alloy, aluminum, aluminum alloy, and the like. In addition, the p-side electrode 16 may include a metal protective film (barrier metal) formed on the reflection electrode, in order to prevent the reflection electrode from the sulfurization and the oxidization.

The p-side electrode 16 provided on the first region that includes the light emitting layer 13 has the larger area than the n-side electrode 17 that is provided on the second region not including the light emitting layer 13. Accordingly, a relatively wide light emitting area is obtained. Here, the layout of the p-side electrodes 16 and the n-side electrodes 17, which is shown in FIG. 5B, is an example, and the embodiment is not limited thereto.

In addition, a silicon nitride film or a silicon oxide film may be formed as a passivation film by using a chemical vapor deposition (CVD) method between the p-side electrode 16 and the n-side electrode 17 or on the end face (side surface) of the light emitting layer 13. In addition, activated annealing may be performed as necessary for forming an ohmic contact between each electrode and the semiconductor layer.

Next, after all the parts formed on the major face of the substrate 10 are covered with an insulating film 18, and the insulating film 18 is patterned, for example, by using wet etching, whereby first openings 18a and a second opening 18b are selectively formed as shown in FIG. 6A. A plurality of the first openings 18a are formed in the insulating film 18, and each of the first openings 18a reaches the p-side electrodes 16. The second opening 18b also reaches the n-side electrode 17.

For example, an organic material such as a photosensitive polyimide or benzocyclobutene can be used as the material of the insulating film 18. In such a case, the insulating film 18 can be directly exposed and developed using photo-lithography, and the first and second openings 18a, 18b are directly formed therein without using a resist mask.

Alternatively, an inorganic film such as a silicon nitride film or a silicon oxide film may be used as the insulating film 18. In a case where the insulating film 18 is an inorganic film, the first openings 18a and the second opening 18b are formed using selective etching using a resist mask formed on the insulating film 18.

Next, as shown in FIG. 6B, a metal film 19 is formed on the surface of the insulating film 18, the inner walls (the side wall and the bottom portion) of the first opening 18a, and the inner wall (the side wall and the bottom portion) of the second opening 18b. The metal film 19 is used as a seed metal for plating, which will be described later.

The metal film 19, for example, is formed using sputtering method. The metal film 19 includes a stacked film, for example, in which a titanium (Ti) layer and a copper (Cu) layer are stacked in order from the insulating film 18 side. Alternatively, an aluminum layer may be replaced by the titanium layer.

Next, as shown in FIG. 6C, resists 91 are selectively formed on the metal film 19, and Cu electroplating is performed using the metal film 19 as a current path.

Accordingly, as shown in FIG. 7A and FIG. 7B corresponding to the lower face of FIG. 7A, a p-side interconnection layer 21 and an n-side interconnection layer 22 are selectively formed on the metal film 19. The p-side interconnection layer 21 and the n-side interconnection layer 22 are made of copper material simultaneously formed using copper plating, for example.

The p-side interconnection layer 21 is also formed inside the first openings 18a and is electrically connected to the p-side electrode 16 via the metal film 19. In addition, the n-side interconnection layer 22 is formed also inside the second openings 18b and is electrically connected to the n-side electrodes 17 via the metal film 19.

Furthermore, as illustrated in FIG. 7B, a plurality, of protrusive parts 21p is provided on the side of the p-side interconnect layer 21 that faces the n-side interconnect layer 22. Meanwhile, a plurality of protrusive parts 22p is provided on the side of the n-side interconnect layer 22 that faces the p-side interconnect layer 21. The protrusive parts 22p are arranged in a mutually nested shape and extend between adjacent protrusive parts 21p.

The resists 91 that are used for plating the p-side interconnection layer 21 and the n-side interconnection layer 22 are removed using solvent or oxygen plasma.

Next, as shown in FIG. 8A and FIG. 8B corresponding to the lower face of FIG. 8A, resists 92 are formed for forming metal pillars. The resist 92 is thicker than the above-described resist 91. It may be possible to leave the resists 91 without removing in the previous process, and the resists 92 are formed so as to overlap the resists 91. First openings 92a and second openings 92b are formed in the resists 92.

Then, Cu electroplating is performed using the metal film 19 as a current path and the resists 92 as a mask. Accordingly, as shown in FIG. 9A and FIG. 9B corresponding to the lower face of FIG. 9A, a p-side metal pillar 23 and an n-side metal pillar 24 are formed on the p-side interconnection layer 21 and n-side interconnection layer 22 respectively.

The p-side metal pillar 23 is formed on the p-side interconnection layer 21 inside the first opening 92a that is formed in the resist 92. The n-side metal pillar 24 is formed on the n-side interconnection layer 22 inside the second opening 92b that is formed in the resist 92. The p-side metal pillar 23 and the n-side metal pillar 24 are made of copper material simultaneously formed using copper plating, for example.

The resist 92, as shown in FIG. 10A is removed, for example, by using solvent or oxygen plasma. Thereafter, exposed parts of the metal film 19 are removed by wet etching while using the p-side metal pillar 23, the n-side metal pillar 24, the p-side interconnection layer 21, and the n-side interconnection layer 22 as a mask. Accordingly, the p-side interconnection layer 21 and the n-side interconnection layer 22 is separated from each other on the insulating film 18 as shown in FIG. 10B, cutting off the electric connection therebetween.

Next, as shown in FIG. 11A, a resin layer 25 is stacked on the insulating film 18. The resin layer 25 covers the p-side interconnection layer 21, the n-side interconnection layer 22, the p-side metal pillar 23, and the n-side metal pillar 24.

The resin layer 25 has an insulating property. In addition, for example, carbon black may be dispersed in the resin layer 25 so as to shield the light emitted from the light emitting layer 13.

Next, the substrate 10 is removed as shown in FIG. 11B. In a case where the substrate 10 is a sapphire substrate, the substrate 10 can be removed, for example, by using a laser lift-off method. In a case where the substrate 10 is a silicon substrate, the substrate 10 can be removed by etching from the first semiconductor layer 11. Since the p-side metal pillar 23, the n-side metal pillar 24 and the resin layer 25 reinforce the semiconductor layer 15, the wafer shape can be maintained even after removing the substrate 10.

In the case using the laser lift-off method, laser light is emitted from the backside of the substrate 10 toward the first semiconductor layer 11. The laser light has transparency for the substrate 10 and has a wavelength in an absorption band of the first semiconductor layer 11. When the laser light arrives at an interface between the substrate 10 and the first semiconductor layer 11, part of the first semiconductor layer 11 that is located near the interface absorbs energy of the laser light and decomposes. The first semiconductor layer 11 is decomposed into gallium (Ga) and nitrogen gas. According to the decomposition reaction, a minute gap is formed between the substrate 10 and the first semiconductor layer 11, whereby the substrate 10 and the first semiconductor layer 11 are separated from each other.

The first face 15a of the semiconductor layer 15 is cleaned after removing the substrate 10 therefrom. For example, gallium (Ga) that is stuck to the first face 15a is removed by using rare hydrofluoric acid or the like. Thereafter, wet etching is performed for the first face 15a, for example, by using a potassium hydroxide (KOH) solution, tetramethylammonium hydroxide (TMAH), or the like. Accordingly, the concavo-convex is formed on the first face 15a due to a difference in the etching speed that depends on the direction of the crystal plane, as shown in FIG. 12A. Alternatively, the concavo-convex may be formed on the first face 15a by etching using a resist mask. The concavo-convex formed on the first face 15a may improve the light extraction efficiency.

Next as shown in FIG. 12B, a fluorescent substance layer 30 is formed on the first face 15a. The fluorescent substance layer 30 is also formed on the insulating film 18 between semiconductor layers 15 adjacent to each other. A transparent resin 31 of a liquid phase in which fluorescent substances 32 are dispersed is supplied to the upper side of the first face 15a, for example, by using a method such as a printing method, a potting method, a molding method, or a compression molding, and thermally cured thereafter.

Figure 13A:
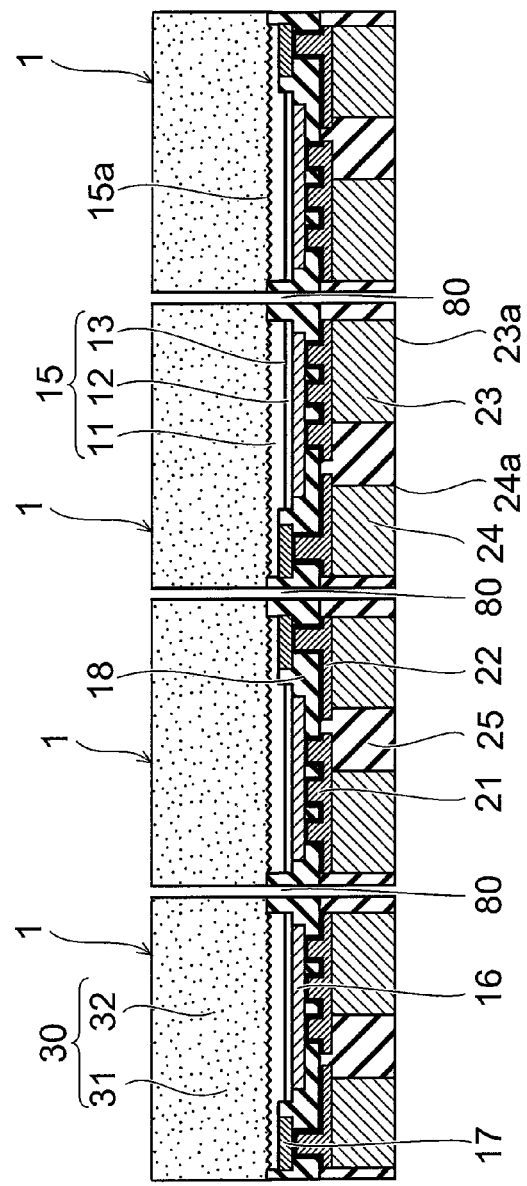
Figure 13B:
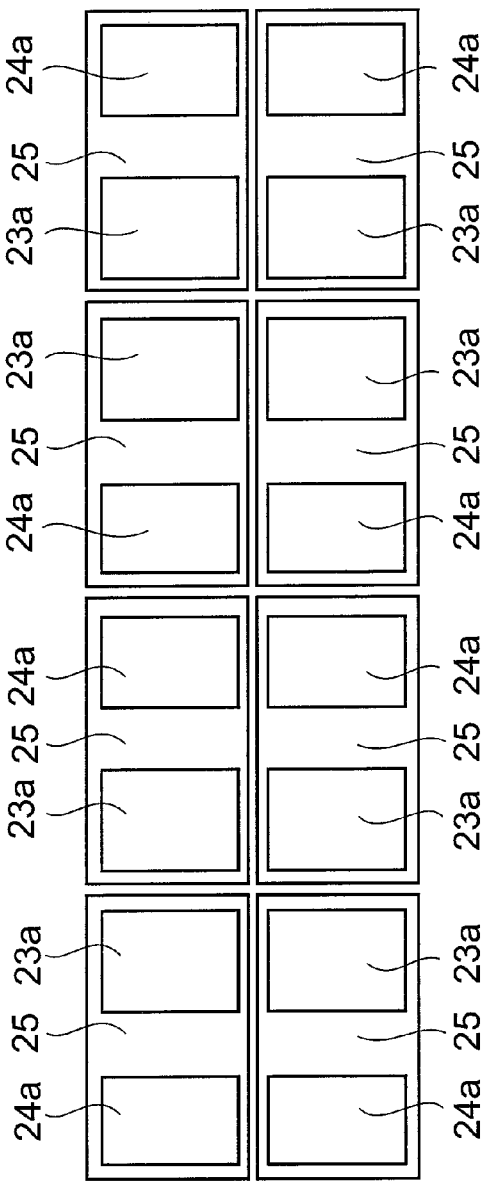

Next, the surface (the lower face in FIG. 12B) of the resin layer 25 is ground such that the p-side external terminals 23a and the n-side external terminals 24a are exposed as shown in FIG. 13A and FIG. 13B.

Thereafter, at the position of the above-described groove 80, the transparent film 35, the wafer is diced through the fluorescent substance layer 30, the insulating film 18, and the resin layer 25 so as to separate into a plurality of semiconductor light emitting devices 1. For example, the dicing is performed using a dicing blade. Alternatively, the dicing may be performed using laser radiation. In addition, the semiconductor light emitting device 1 may have a single chip structure that includes one semiconductor layer 15 or a multiple-chip structure that includes a plurality of semiconductor layers 15.

When the dicing is performed, the substrate 10 has been already removed. Since the semiconductor layer 15 is also removed in the groove 80, the semiconductor layer 15 can be prevented from damage, while the dicing is performed. In addition, the end portion (side surface) of the semiconductor layer 15 is covered with the insulating film 18. Thereby, the protection of the end portion can be obtained without any additional process after dicing into the plurality of semiconductor light emitting devices 1.

Since each diced device includes a package protecting the semiconductor 15 and the interconnection formed therein, and the above-described manufacturing process before dicing are performed in the wafer state, it is possible to significantly reduce the production cost. In other words, the interconnection and the packaging are completed at the diced state. Accordingly, the productivity can be improved, and, as a result, the lowered price can be achieved in an easy manner.

Figure 14A:
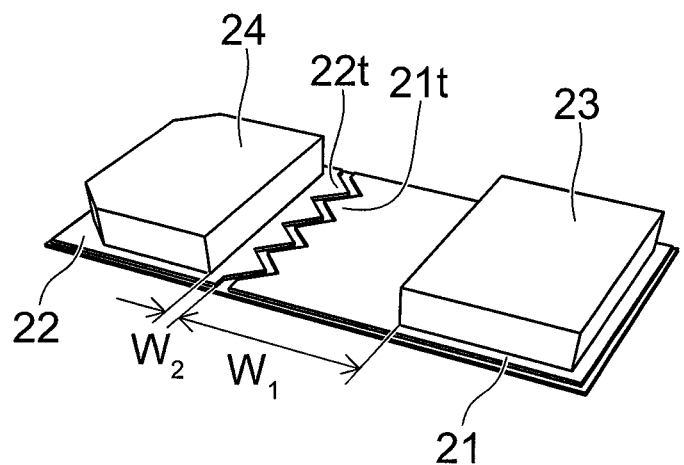
FIGS. 14A and 14B are schematic cross-sectional views of a semiconductor light emitting device according to a variation of the first embodiment.
Figure 14B:
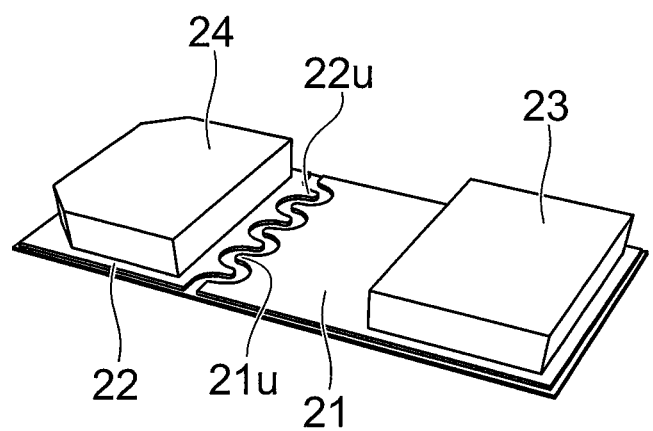

FIGS. 14A and 14B are perspective views schematically illustrating a p-side interconnection and an n-side interconnection according to a variation of the embodiment. The shapes of the protrusive parts provided on the p-side interconnect layer 21 and the n-side interconnect layer 22 respectively are different.

As illustrated in FIG. 14A, a protrusive part 21t of the p-side interconnect layer 21 and a protrusive part 22t of the n-side interconnect layer 22 may be provided in a triangular shape. In addition, as illustrated in FIG. 14B, protrusive parts 21u and protrusive parts 22u may also be configured in a curved line so to not have corners. In this case, mutually facing side surfaces 21c and 22c (see FIG. 1) of the p-side interconnect layer 21 and the n-side interconnect layer 22 include a curved surface.

Figure 15A:
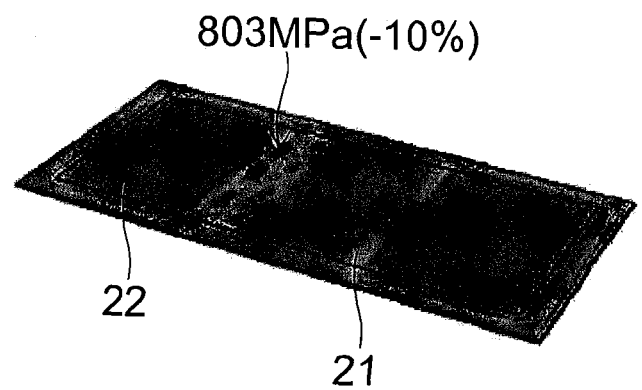
FIGS. 15A to 15D are schematic diagrams illustrating characteristics of the semiconductor light emitting device according to the variation of the first embodiment.
Figure 15B:
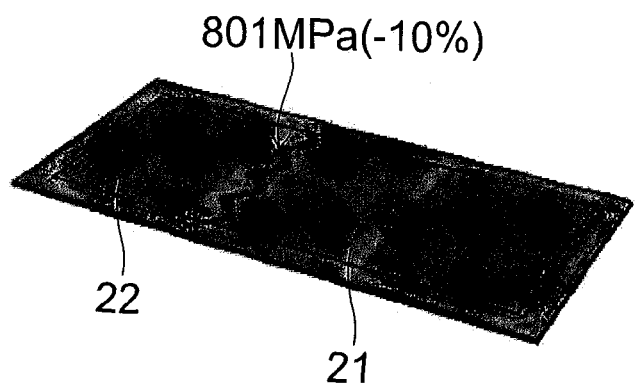
Figure 15C:
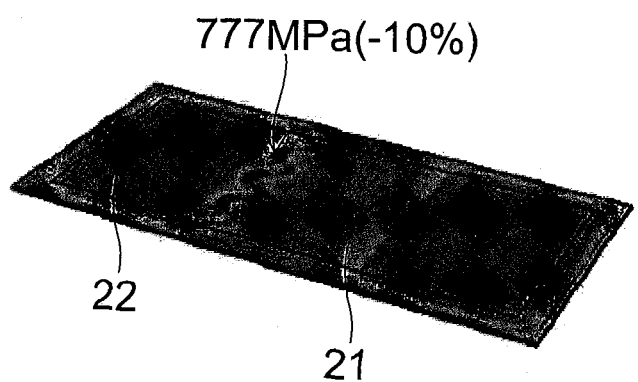
Figure 15D:
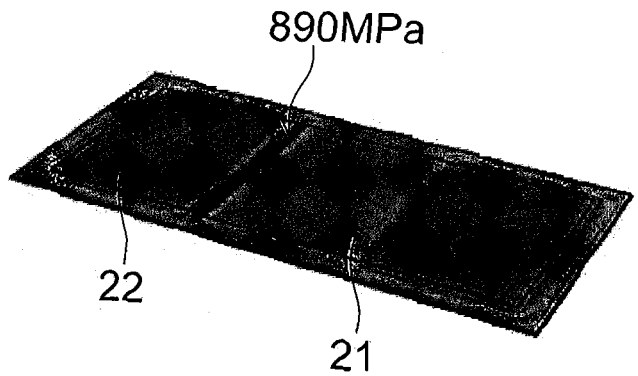

FIGS. 15A to 15D are schematic diagrams illustrating simulation results of stress on differing protrusive part shapes provided on the p-side interconnect layer 21 and the n-side interconnect layer 22. FIG. 15A depicts the stress distribution when providing the rectangular protrusive parts 21p and 22p illustrated in FIG. 1B; FIG. 15B depicts the stress distribution when providing triangular protrusive parts 21t and 22t illustrated in FIG. 14A; and FIG. 15C depicts the stress distribution when providing the protrusive parts 21u and 22u configured in the curved line illustrated in FIG. 14B. FIG. 15D depicts the stress distribution according to a comparative example in which a protrusive part is not provided in the p-side interconnect layer 21 and the n-side interconnect layer 22 but where linear shaped sides are made to face each other. In each figure, tensile stress occurs between the p-side interconnect layer 21 and the n-side interconnect layer 22, and the color of the region where the stress concentrates is illustrated darker than other areas.

In the example illustrated in FIG. 15A, the color of the area corresponding to the top part of the rectangular protrusive parts 21p and protrusive parts 22p, respectively, is dark so as to see that there is high stress. Also, the maximum value of the stress occurring at the area corresponding to the top part of the protrusive parts 21p of the p-side interconnect layer 21 is 803 MPa (mega Pascals).

In the example illustrated in FIG. 15B, it can be seen that stress occurs uniformly along the triangular protrusive parts 21t and protrusive parts 22t. Also, the maximum value thereof is 801 MPa.

In the example illustrated in FIG. 15C, the color of the area corresponding to the top part of the protrusive parts 21u and protrusive parts 22u configured of a curved line, respectively, is dark so as to see that there is high stress. Also, the maximum value of the stress occurring at the area corresponding to the top part of the protrusive parts 21u of the p-side interconnect layer 21 is 777 MPa.

In the comparative example illustrated in FIG. 15D, stress occurs uniformly along each side between the p-side interconnect layer 21 and the n-side interconnect layer 22, and the maximum value thereof is 890 MPa.

Compared to the comparative example illustrated in FIG. 15D, the maximum value of tensile stress is reduced in the examples illustrated in FIGS. 15A to 15C, and the relieving of stress by providing the protrusive parts can be confirmed. In the examples illustrated in FIGS. 15A and 15B, the maximum value of stress is 10% reduced compared to the comparative example. In addition, with the protrusive parts 21u and 22u illustrated in FIG. 15C, it can be seen that there is a large relieving effect as the maximum value of stress is 13% reduced compared to the comparative example.

In the examples illustrated in FIGS. 15A and 15C, the stress applied to the semiconductor layer 15 is dispersed on the top parts of each protrusive part. In the example illustrated in FIG. 15B, stress occurs uniformly between the p-side interconnect layer 21 and the n-side interconnect layer 22 as with the comparative example illustrated in FIG. 15D but the maximum value thereof is reduced more than that of the comparative example. Thus, it can be seen that the stress can be reduced by providing protrusive parts on the mutually facing sides of the p-side interconnect layer 21 and the n-side interconnect layer 22.

The tensile stress between the p-side interconnect layer 21 and the n-side interconnect layer 22 occurs primarily in the direction from the p-side interconnect layer 21 to the n-side interconnect layer 22. If this direction is a first direction, in FIG. 15D, mutually facing sides of the p-side interconnect layer 21 and the n-side interconnect layer 22 are formed along a second direction that is perpendicular to the first direction. Therefore, stress occurs in the first direction on the side between the p-side interconnect layer 21 and the n-side interconnect layer 22.

The stress in the second direction perpendicular to the first direction is extremely low. Accordingly, when a side is provided along the first direction from the p-side interconnect layer 21 to the n-side interconnect layer 22, the stress in that area between the p-side interconnect layer 21 and the n-side interconnect layer 22 becomes extremely low.

In FIG. 15A, rectangular protrusive parts are provided, and the sides along the second direction (top parts of the protrusive parts) are formed at dispersed positions between the p-side interconnect layer 21 and the n-side interconnect layer 22. Further, the sides along the first direction (side parts of the protrusive parts) of the p-side interconnect layer 21 and the n-side interconnect layer 22 are formed between the top parts. Therefore, the stress between the p-side interconnect layer 21 and the n-side interconnect layer 22 is divided into the dispersed positions and can be relieved.

The triangular protrusive parts are provided in FIG. 15B, and the sides of the p-side interconnect layer 21 or the n-side interconnect layer 22 are mainly in a diagonal direction between the first direction and the second direction. Therefore, stress between the p-side interconnect layer 21 and the n-side interconnect layer 22 occurs so as to include components of both in the first direction and the second direction. Then, the stress can be relieved by dividing into the second direction where the tensile component is not induced.

In FIG. 15C, protrusive parts configured of a curved line are provided on the side of the p-side interconnect layer 21 or the n-side interconnect layer 22. This protrusive part has a shape where the component in the first direction is reduced as the direction of the stress between the p-side interconnect layer 21 and the n-side interconnect layer 22 changes from the first direction to the second direction along the curved line, and it makes a large stress relieving effect.

In the examples illustrated in FIGS. 14 and 15, a space $W_1$ between the side of the p-side interconnect layer 21 facing the n-side interconnect layer 22 and the p-side metal pillar 23 is wider than a space $W_2$ between the side of the n-side interconnect layer 22 facing the p-side interconnect layer 21 and the n-side metal pillar 24 (see FIG. 14A). Further, it can be seen that the stress in the area that corresponds to the top parts increases near the n-side metal pillar 24 in the examples illustrated in FIGS. 15A and 15B. In other words, the stress increases in the region corresponding to the top parts of each protrusive part, and becomes larger in the region positioned on the narrower side of the space $W_1$ and the space $W_2$. Accordingly, it is effective for each protrusive part to be provided away from the respective p-side metal pillar 23 and n-side metal pillar 24. In other words, providing each protrusive part in the center between the p-side metal pillar 23 and the n-side metal pillar 24, where the space $W_1$ is equal to the space $W_2$, enables the stress to be reduced.

Providing protrusive parts on the mutually facing sides of the p-side interconnection 21 and the n-side interconnection 22 in this manner enables the stress induced therebetween to be relieved. In addition, reducing the stress applied to the semiconductor layer 15 may suppress the variance in optical properties, for example, creep or the like in I-L characteristic.

FIGS. 16A to 16D are plan views schematically illustrating a p-side interconnection and an n-side interconnection of a semiconductor light emitting device according to another variation of the embodiment. The dotted line illustrated in each figure shows an outer edge of the semiconductor layer 15.

Figure 16A:
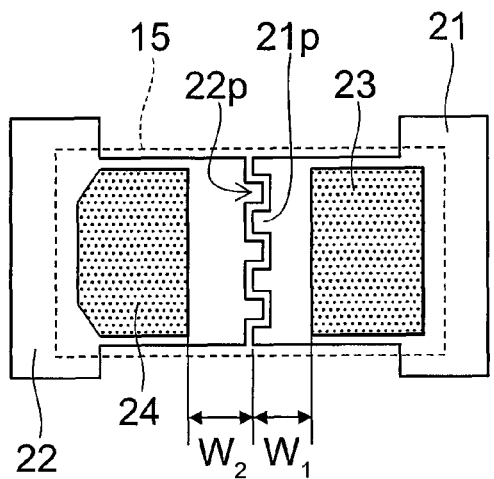
FIGS. 16A to 16D are schematic cross-sectional views of a semiconductor light emitting device according to another variation of the first embodiment.

In FIG. 16A, the p-side interconnect layer 21 and the n-side interconnect layer 22 widen in the horizontal direction of each figure respectively and extend over the outer edge of the semiconductor layer 15. The protrusive parts 21p and protrusive parts 22p are provided on the mutually facing sides of the p-side interconnect layer 21 and the n-side interconnect layer 22 respectively. In addition, the space $W_1$ between the p-side metal pillar 23 and each protrusive part 21p is equal to the space $W_2$ between the n-side metal pillar 24 and each protrusive part 22p.

Figure 16B:
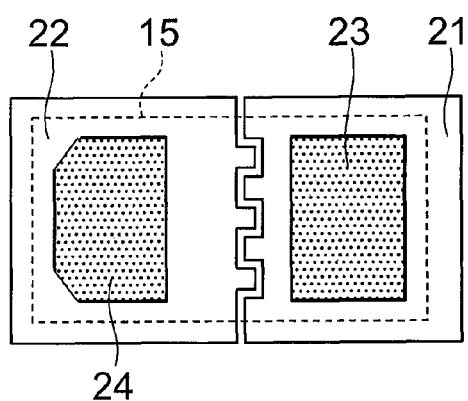

In FIG. 16B, the p-side interconnect layer 21 and the n-side interconnect layer 22 extend over the outer edge of the semiconductor layer 15. In other words, the p-side interconnect layer 21 and the n-side interconnect layer 22 are disposed so as to cover the semiconductor layer 15.

Figure 16C:
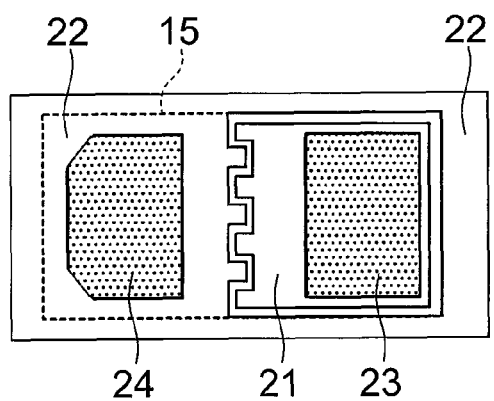

In FIG. 16C, the p-side interconnect layer 21 is provided on the semiconductor layer 15, however, the n-side interconnect layer 22 extends over the outer edge of the semiconductor layer 15. In addition, the n-side interconnect layer 22 is disposed so as to enclose around the p-side interconnect layer 21.

Figure 16D:
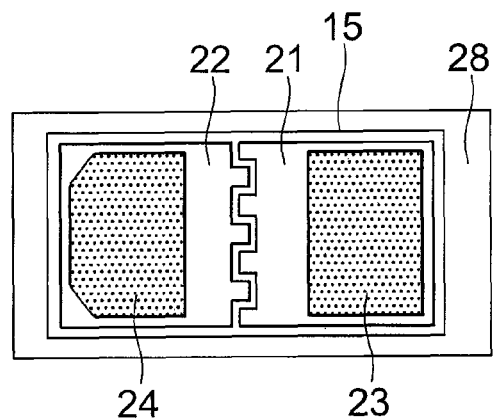

In FIG. 16D, the p-side interconnect layer 21 and the n-side interconnect layer 22 are disposed on the semiconductor 15. Further, an interconnect layer 28 that encloses the p-side interconnect layer 21 and the n-side interconnect layer 22 is provided on the outer periphery of the semiconductor layer 15.

Extending the p-side interconnect layer 21 and the n-side interconnect layer 22 to the outer side of the semiconductor layer 15, and providing a separate interconnect layer in this manner, allows the semiconductor layer 15 to be covered. Meanwhile, as illustrated in each figure, the p-side metal pillar and the n-side metal pillar 24 are disposed on the semiconductor layer 15.

Alternatively, as a further variation of the embodiment, the p-side interconnect layer 21 and the n-side interconnect layer 22 may be bonded to pads of a mounting substrate without providing the p-side metal pillar 23 and the n-side metal pillar 24. In addition, the p-side interconnect layer 21 and the p-side metal pillar 23 are not restricted to being formed through the separate processes, and a p-side interconnection may be integrally provided by forming the p-side interconnect layer 21 and the p-side metal pillar 23 in the same process. Similarly, the n-side interconnect layer 22 and the n-side metal pillar 24 are not restricted to being formed through the separate processes, and an n-side interconnection may be integrally provided by forming the n-side interconnect layer 22 and the n-side metal pillar 24 in the same process.

Second Embodiment

FIG. 17 is a schematic view illustrating characteristics of a semiconductor light emitting device according to a second embodiment. In the embodiment, the configuration and the manufacturing method of the semiconductor light emitting device are the same as the first embodiment, and the stress applied to a wafer is controlled during the manufacturing process thereof. Alternatively, the p-side interconnect layer 21 and the n-side interconnect layer 22 may take a form in which there is not a plurality of protrusive parts on mutually facing sides.

FIG. 17 is a cross-sectional view schematically illustrating the curve of a wafer in various manufacturing processes. A silicon substrate with a diameter from 4 to 8 inch φ and a thickness of from 0.725 to 1.5 mm is used as the substrate 10. Note that a wafer here refers to a state until the semiconductor light emitting device 1 is diced into chip regardless of the existence of a substrate.

In the process where the semiconductor layer 15 is epitaxially grown on the substrate 10 until the p-side interconnect layer 21 and the n-side interconnect layer 22 are formed (see FIGS. 2 to 7), the wafer curves so as to be downward convex, where the semiconductor layer 15 is on top and the substrate 10 is on the bottom.

In the process where the p-side metal pillar 23 and the n-side metal pillar 24 are respectively formed on the p-side interconnect layer 21 and the n-side interconnect layer 22 until the insulating film 25 (second insulating film) is formed on the side of the second face 15b of the semiconductor layer 15 (see FIGS. 8 to 11A), the direction of the curve of the wafer does not change, and the wafer curves so as to be downward convex, where the semiconductor layer 15 is on top and the substrate 10 is on the bottom.

In the embodiment, a material and thickness of the insulating film 25 is selected so that when the substrate 10 is removed from the first face 15a of the semiconductor layer 15, the curve of the wafer is stably upward convex, where the insulating layer 25 is on top and the semiconductor layer 15 is on the bottom.

For example, a material of the insulating film 25 is selected to have a value of a thermal expansion coefficient near to that of the semiconductor layer 15, whereby reducing the stress applied to the semiconductor layer 15. Further, a material of the insulating film 25 preferably has high rigidity in order to support the semiconductor layer 15 after removing the substrate 10.

As shown in Table 1, it is desired that the insulating film 25 has a thermal expansion coefficient in a range of 5 to 10 ppm, an elastic modulus in a range of 10 to 25 GPa, and a thickness of 0.5 to 3.0 mm. As long as it is within these conditions, the curve of a wafer can be stably held so as to be upward convex after removing the substrate 10, where the insulating film 25 is on top and the semiconductor layer 15 is on the bottom. Material suited to these conditions is for example, an epoxy resin.

In addition, after forming a fluorescent substance layer 30 on the first face 15a of the semiconductor layer 15, the curve of the wafer is held so as to be upward convex, where the insulating film 25 is on top and the fluorescent substance layer 30 is on the bottom. Hence, it is desired that the fluorescent substance layer 30 has a thermal expansion coefficient in a range of 100 to 150 ppm, an elastic modulus in a range of 0.08 to 0.8 GPa, and a thickness of 0.03 to 0.1 mm as shown in Table 1. Material suited to these conditions is, for example, silicone.

TABLE 1

| | Thermal expansion coefficient (ppm) | Elastic modulus (Gpa) | Film thickness (mm) |
|---|---|---|---|
| Second insulating film | 5-10 | 10-25 | 0.5-3.0 |
| Fluorescent substance layer | 100-150 | 0.08-0.8 | 0.03-0.1 |

Figure 18:
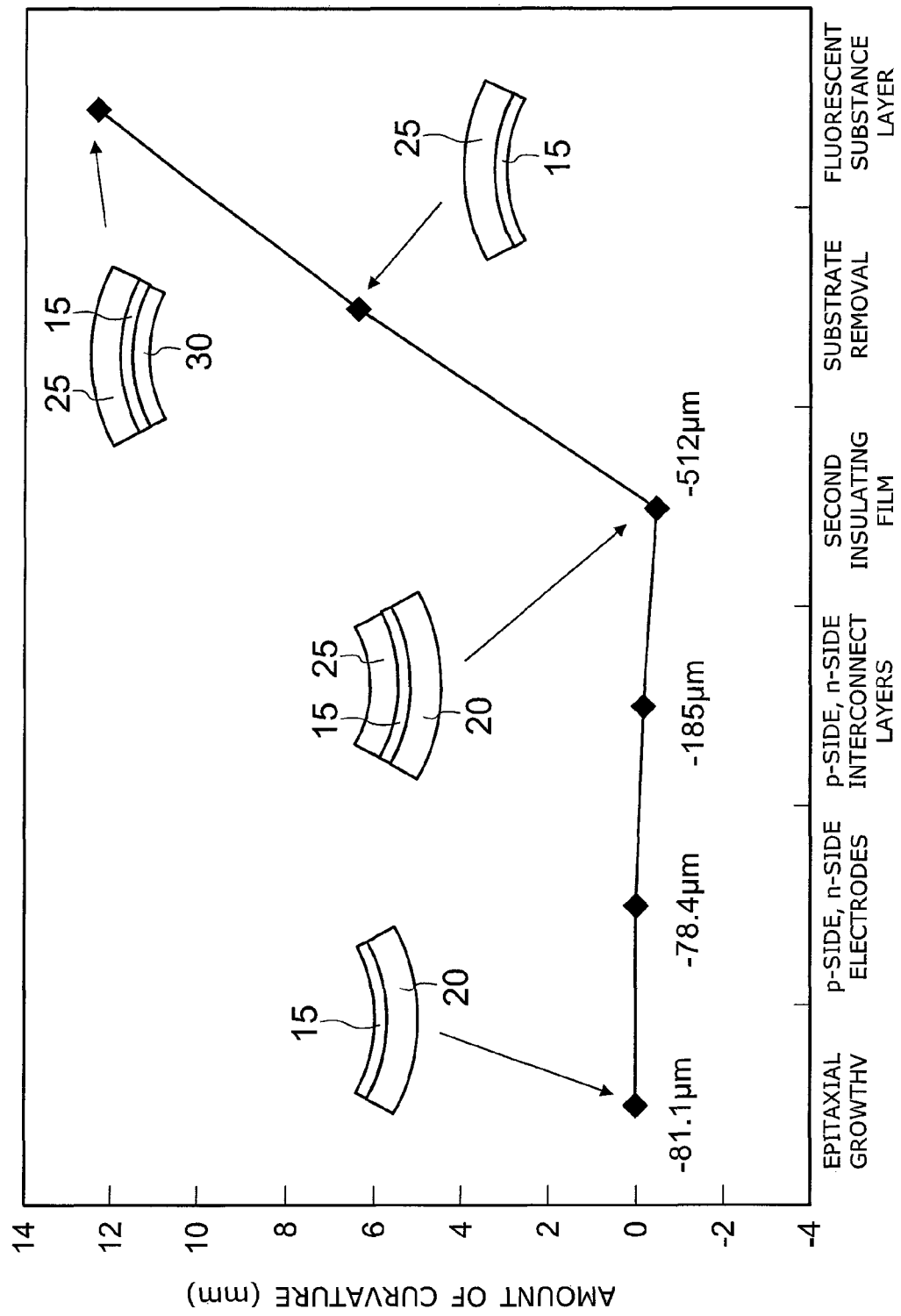
FIG. 18 is a graph showing characteristics of a semiconductor light emitting device according to the second embodiment.

Silicon substrate: from 4 inches to 8 inches φ/thickness of from 0.725 to 1.5 mm FIG. 18 is a graph showing an example of characteristics of a semiconductor light emitting device according to the embodiment. The horizontal axis shows the manufacturing processes, and the vertical axis shows the amount of curvature of the wafer in each process. In this example, a silicon substrate with a diameter of 8-inch φ and a thickness of 1.5 mm is used as the substrate. In addition, the insulating film 25 has a thermal expansion coefficient of 7 ppm, an elastic modulus of 18.4 GPa, and a thickness of 0.5 mm. Meanwhile, the fluorescent substance layer 30 has a thermal expansion coefficient of 120 ppm, an elastic modulus of 0.8 GPa, and a thickness of 0.1 mm.

As illustrated in FIG. 18, from epitaxial growth to the formation of the insulating film 25, the wafer has a downward convex curve, where the substrate 10 is on the bottom. Also, after removing the substrate 10, the wafer is rotated to have an upward convex curve, where the semiconductor layer 15 is on the bottom. In addition, when forming the fluorescent substance layer 30, the amount of curvature increases in the same direction. While the amount of curvature until forming the insulating film 25 is not more than 1 mm, the amount of curvature after removing the substrate 10 is 6.4 mm, and the amount of curvature after forming the fluorescent substance layer 30 increases to 12.3 mm. Thereby, the upward convex curve can be stably held in a state where the insulating film 25 is on top and either the semiconductor layer 15 or the fluorescent substance layer 30 is on the bottom.

Constantly maintaining the direction of curvature of the wafer after removing the substrate 10 in this manner may stabilizes the conditions of the subsequent processes. Thereby, it becomes possible to stabilize the process and to increase manufacturing efficiency.

Third Embodiment

Figure 19A:
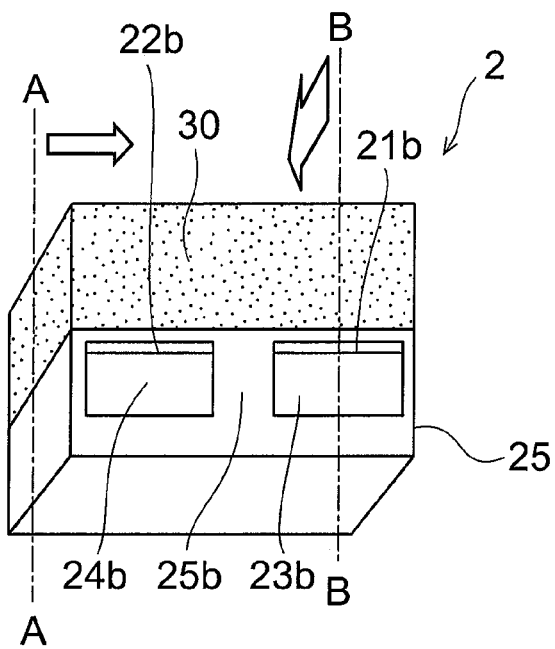
FIGS. 19A to 19C are schematic views of a semiconductor light emitting device according to a second embodiment.
Figure 19B:
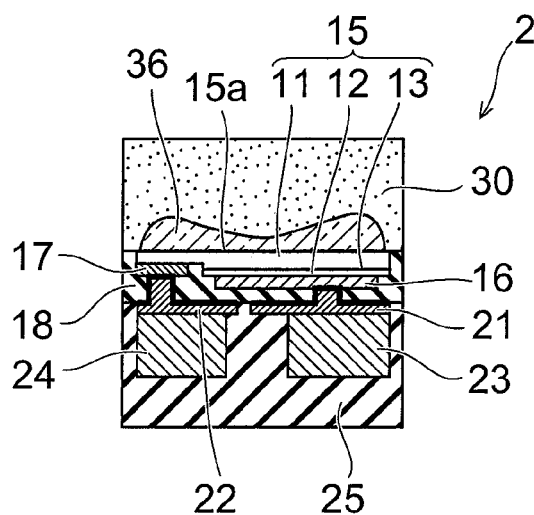
Figure 19C:
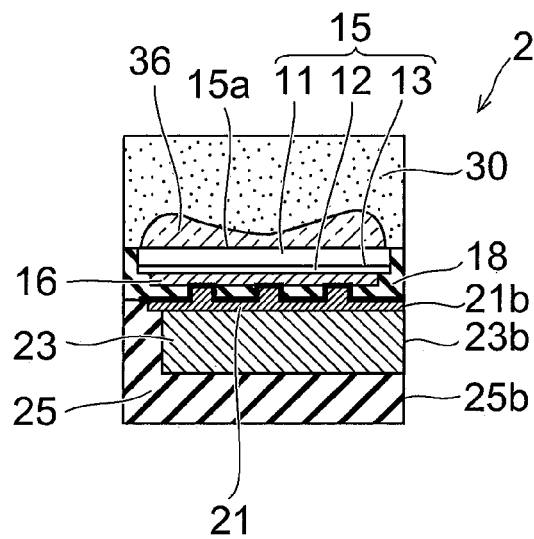
Figure 20:
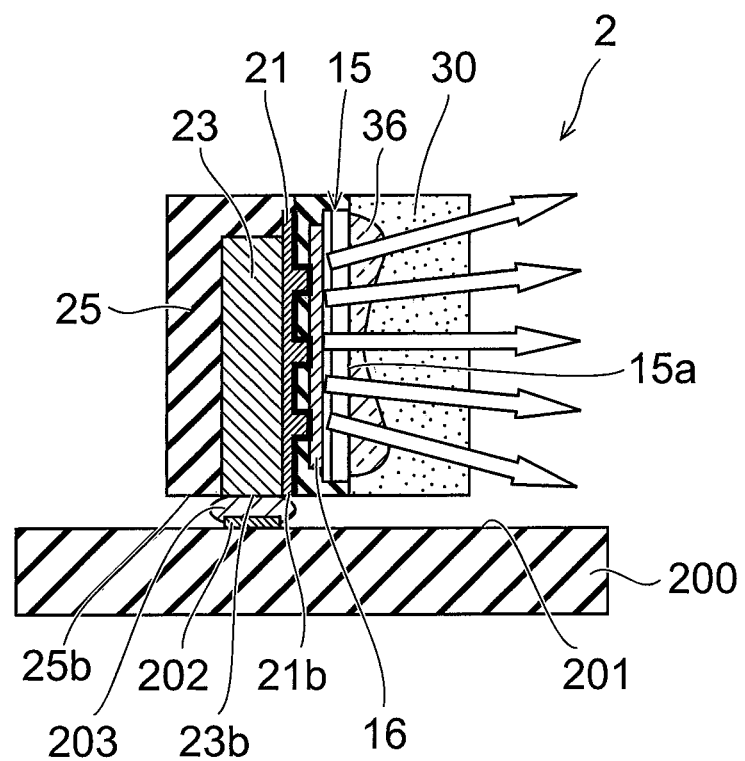
FIG. 20 is a schematic cross-sectional view of a light emitting module, in which the semiconductor light emitting device illustrated in FIGS. 19A to 19C is mounted on a mounting substrate.

FIG. 19A is a schematic perspective view of a semiconductor light emitting device 2 according to a second embodiment. FIG. 19B is a cross-sectional view taken along line A-A shown in FIG. 19A. FIG. 19C is a cross-sectional view taken along line B-B shown in FIG. 19A. FIG. 20 is a schematic cross-sectional view of a light emitting module that has a configuration in which the semiconductor light emitting device 3 is mounted on a mounting substrate 200.

As shown in FIGS. 19A and 19C, a part of the side surface of the p-side metal pillar 23 is exposed from the resin layer 25 on a third face 25b that has a plane direction different from the first face 15a and the second face of the semiconductor layer 15. The exposed face serves as a p-side external terminal 23b for mounting the semiconductor light emitting device on an external mounting substrate.

The third face 25b is a face that is approximately perpendicular to the first face 15a and the second face of the semiconductor layer 15. The resin layer 25, for example, has four side surfaces of a rectangular shape, and one of the four side surfaces is the third face 25b.

A part of the side surface of the n-side metal pillar 24 is exposed from the resin layer 25 on the third face 25b. The exposed face serves as an n-side external terminal 24b for mounting the semiconductor light emitting device on the external mounting substrate.

In addition, as shown in FIG. 19A, a part of the side surface 21b of the p-side interconnection layer 21 is also exposed from the resin layer 25 on the third face 25b and serves as a p-side external terminal. Similarly, a part of the side surface 22b of the n-side interconnection layer 22 is also exposed from the resin layer 25 on the third face 25b and serves as an n-side external terminal.

Parts of the p-side metal pillar 23 other than the p-side external terminal 23b that is exposed on the third face 25b is covered with the resin layer 25. In addition, parts of the n-side metal pillar 24 other than the n-side external terminal 24b that is exposed on the third face 25b is covered with the resin layer 25.

In addition, in the p-side interconnect layer 21, portions other than the side surface 21b that is exposed to a third face 25b are covered by the insulating film 25. In the n-side interconnect layer 22, the insulating film 25 covers portions other than the side surface 22b that is exposed to the third face 25b. Additionally, a plurality of protrusive parts is provided in a similar manner as that given in the first embodiment on the mutually facing sides of the p-side interconnect layer 21 and the n-side interconnect layer 22.

A lens 36 is provided between the first face 15a and the fluorescent substance layer 30. The lens 36 focuses the light emitted from the light emitting layer 13 and improves the light distribution. It may be also possible not to provide the lens 36.

The semiconductor light emitting device 2, as shown in FIG. 20, is mounted in a posture in which the third face 25b faces the mounting face 201 of the mounting substrate 200. The p-side external terminal 23b and the n-side external terminal 24b that are exposed on the third face 25b are bonded to the pad 202 that is formed on the mounting face 201 through soldering 203. In addition, an interconnection pattern is formed on the mounting face 201 of the mounting substrate 200, and the pad 202 is connected to the interconnection pattern.

The third face 25b is approximately perpendicular to the first face 15a that is the major light emitting face. Accordingly, in the posture in which the third face 25b is disposed toward the lower side, i.e. facing the mounting face 201 side, the first face 15a faces in the horizontal direction, not the upper side of the mounting face 201. That is, the semiconductor light emitting device 3 is a so-called side view type device in which light is emitted in the horizontal direction in a case where the mounting face 201 is set as the horizontal plane.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor light emitting device, comprising:
   a semiconductor layer having a first face, a second face on a side opposite to the first face, and a light emitting layer;
   a p-side electrode provided on the semiconductor layer;
   an n-side electrode provided on the semiconductor layer;
   a p-side interconnection element electrically connected to the p-side electrode;
   an n-side interconnection element electrically connected to the n-side electrode and separated from the p-side interconnection element, and
   an interconnection layer around the p-side interconnection element and the n-side interconnection element and extending beyond an outer periphery of the semiconductor layer, the p-side interconnection element, and the n-side interconnection element,
   wherein the p-side interconnection element includes a p-side interconnection layer, covering at least a part of the p-side electrode, and a p-side metal pillar provided on the p-side interconnection layer; and
   the n-side interconnection element includes an n-side interconnection layer, covering at least a part of the n-side electrode, and an n-side metal pillar provided on the n-side interconnection layer, the n-side metal pillar being separated from the p-side metal pillar by a first distance and aligned along a first direction,
   the p-side interconnection layer has a plurality of first protrusive parts protruding toward the n-side interconnection layer,
   the n-side interconnection layer has a plurality of second protrusive parts between the plurality of first protrusive parts of the p-side interconnection layer, and
   the plurality of first protrusive parts and the plurality of second protrusive parts are disposed alternatively along a second direction crossing the first direction between one side of the p-side metal pillar and one side of the n-side metal pillar facing the one side of the p-side metal pillar.

2. The device according to claim 1, wherein each of the first protrusive parts has a rectangular shape.

3. The device according to claim 1, wherein each of the first protrusive parts has a triangular shape.

4. The device according to claim 1, wherein each surface of the first protrusive parts that is facing the n-side interconnection layer includes a curved face within a plane of the p-side interconnection layer.

5. The device according to claim 1, further comprising:
   a first insulating film covering the p-side electrode, the n-side electrode and the semiconductor layer on the second face side, and having a first opening communicating with the p-side electrode and a second opening communicating with the n-side electrode,
   wherein the p-side interconnection layer is provided on the first insulating film and is electrically connected to the p-side electrode through the first opening;
   the n-side interconnection layer is provided on the first insulating film and is electrically connected to the n-side electrode through the second opening; and the n-side interconnection layer includes an overlying portion on the first insulating film, the overlying portion being wider than a portion of the n-side interconnection layer contacting the n-side electrode.

6. The device according to claim 1, wherein the p-side interconnection element and the n-side interconnection element include at least one metal selected from copper, gold, nickel, and silver.

7. The device according to claim 1, wherein at least one of the p-side interconnection element and the n-side interconnection element has a portion extending to an outer edge of the semiconductor layer.

8. The device according to claim 5, further comprising a second insulating film provided between the p-side interconnection element and the n-side interconnection element.

9. The device according to claim 8, wherein the second insulating film includes epoxy resin.

10. The device according to claim 8, wherein the second insulating film covers a periphery of the p-side metal pillar and a periphery of the n-side metal pillar.

11. The device according to claim 1, further comprising a fluorescent layer provided on the first face.

12. The device according to claim 11, wherein the fluorescent layer includes silicone resin.

13. The device according to claim 1, wherein
the p-side metal pillar has a quadrilateral cross section in a plane parallel to the p-side interconnection layer,
the n-side metal pillar has a cross section in the plane parallel to the p-side interconnection layer that is not quadrilateral and at least one edge of the cross section of the n-side metal pillar is not perpendicular or parallel to the first direction, and
at least a portion of the n-side metal pillar is between the at least one edge of the cross section of the n-side metal pillar and a gap portion that is between the p-side interconnection layer and the n-side interconnection layer.

14. The device according to claim 1, wherein
the n-side metal pillar has a quadrilateral cross section in a plane parallel to the n-side interconnection layer,
the p-side metal pillar has a cross section in the plane parallel to the n-side interconnection layer that is not quadrilateral and at least one edge of the cross section of the p-side metal pillar is not perpendicular or parallel to the first direction, and
at least a portion of the p-side metal pillar is between the at least one edge of the cross section of the p-side metal pillar and a gap portion that is between the p-side interconnection layer and the n-side interconnection layer.

15. The device according to claim 1, wherein a straight line extending in the second direction crosses each of the first and second protrusive parts and does not intersect either the n-side metal pillar or the p-side metal pillar.

16. A semiconductor light emitting device, comprising:
a semiconductor layer having a first face, a second face on a side opposite to the first face, and a light emitting layer, the second face having a quadrilateral shape;
a p-side electrode provided on the semiconductor layer;
an n-side electrode provided on the semiconductor layer;
a p-side interconnection element electrically connected to the p-side electrode; and
an n-side interconnection element electrically connected to the n-side electrode and separated from the p-side interconnection element,
wherein the p-side interconnection element includes a p-side interconnection layer, covering at least part of p-side electrode, and a p-side metal pillar provided on the p-side interconnection layer,
the n-side interconnection element includes an n-side interconnection layer, covering at least part of n-side electrode, and an n-side metal pillar provided on the n-side interconnection layer, the n-side metal pillar being separated from the p-side metal pillar by a first distance and aligned along a first direction,
the p-side interconnection layer has a plurality of first protrusive parts protruding toward the n-side interconnection layer,
the n-side interconnection layer has a plurality of second protrusive parts between the plurality of first protrusive parts of the p-side interconnection layer,
the plurality of first protrusive parts and the plurality of second protrusive parts are disposed alternatively along a second direction crossing the first direction between one side of the p-side metal pillar and one side of the n-side metal pillar facing the one side of the p-side metal pillar, and
at least one of the p-side interconnection layer and the n-side interconnection layer extends beyond an outer periphery of the semiconductor layer such that all four corners of the quadrilateral shape of the second face are covered when viewed along a direction orthogonal to the second face.

17. The device according to claim 16, wherein the p-side interconnection layer extends to cover two corners of the quadrilateral shape of the second face, and the n-side interconnection layer extends to cover the two other corners of the quadrilateral shape of the second face.

18. The device according to claim 16, wherein only one of the p-side interconnection layer and the n-side interconnection layer extends to cover all four corners of the quadrilateral shape of the second face.

19. The device according to claim 16, wherein each surface of the first protrusive parts that is facing the n-side interconnection layer includes a curved face within a plane of the p-side interconnection layer.

* * * * *